United States Patent
Sekine et al.

(10) Patent No.: US 11,532,656 B2
(45) Date of Patent: Dec. 20, 2022

(54) IMAGING DEVICE AND IMAGING SYSTEM

(71) Applicant: CANON KABUSHIKI KAISHA, Tokyo (JP)

(72) Inventors: Hiroshi Sekine, Kawasaki (JP); Yusuke Onuki, Fujisawa (JP); Kazunari Kawabata, Mitaka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 124 days.

(21) Appl. No.: 16/834,735

(22) Filed: Mar. 30, 2020

(65) Prior Publication Data

US 2020/0227457 A1 Jul. 16, 2020

Related U.S. Application Data

(62) Division of application No. 15/844,140, filed on Dec. 15, 2017, now Pat. No. 10,644,049.

(30) Foreign Application Priority Data

Dec. 27, 2016 (JP) .................................. 2016-254360

(51) Int. Cl.
*H01L 27/14* (2006.01)
*H01L 27/146* (2006.01)
(Continued)

(52) U.S. Cl.
CPC .......... *H01L 27/14625* (2013.01); *G01C 3/08* (2013.01); *H01L 27/1461* (2013.01);
(Continued)

(58) Field of Classification Search
CPC ......... H01L 27/14625; H01L 27/14609; H01L 27/1461; H01L 27/14612; H01L 27/14623; H01L 27/14627; H01L 27/14629; H01L 27/14641; H01L 27/14645; H01L 27/14621; H01L 27/1463; H01L 27/14605; G01C 3/08; H04N 5/3559; H04N 5/37452; H04N 5/378

See application file for complete search history.

(56) References Cited

U.S. PATENT DOCUMENTS

| | | |
|---|---|---|
| 2013/0083225 A1 | 4/2013 | Minowa et al. |
| 2015/0349011 A1* | 12/2015 | Kato ................. H01L 27/14625 250/201.4 |
| 2016/0027828 A1 | 1/2016 | Lee |
| 2016/0099268 A1 | 4/2016 | Minowa |
| 2016/0211306 A1 | 7/2016 | Choi |
| 2016/0372503 A1 | 12/2016 | Okuno |

FOREIGN PATENT DOCUMENTS

| | | |
|---|---|---|
| CN | 102017150 A | 4/2011 |
| CN | 105210363 A | 12/2015 |

(Continued)

*Primary Examiner* — Tony Ko
(74) *Attorney, Agent, or Firm* — Canon U.S.A., Inc. IP Division

(57) ABSTRACT

In an imaging device, a photoelectric converter of a first pixel and a photoelectric converter of a second pixel are arranged along a first direction. At least part of a charge accumulation portion of the first pixel is disposed between the photoelectric converter of the first pixel and the photoelectric converter of the second pixel. An exit surface of a light guiding path of the first pixel is longer in a second direction orthogonal to the first direction in plan view than in the first direction.

25 Claims, 16 Drawing Sheets

(51) Int. Cl.
  *H04N 5/378* (2011.01)
  *G01C 3/08* (2006.01)
  *H04N 5/3745* (2011.01)
  *H04N 5/355* (2011.01)

(52) U.S. Cl.
  CPC .. *H01L 27/14609* (2013.01); *H01L 27/14612* (2013.01); *H01L 27/14623* (2013.01); *H01L 27/14627* (2013.01); *H01L 27/14629* (2013.01); *H01L 27/14641* (2013.01); *H01L 27/14645* (2013.01); *H04N 5/3559* (2013.01); *H04N 5/378* (2013.01); *H04N 5/37452* (2013.01); *H01L 27/1463* (2013.01); *H01L 27/14621* (2013.01)

(56) References Cited

FOREIGN PATENT DOCUMENTS

| | | |
|---|---|---|
| JP | 2008-193527 A | 8/2008 |
| JP | 2012-156334 A | 8/2012 |
| JP | 2012-215480 A | 11/2012 |
| JP | 2013-134173 A | 7/2013 |
| JP | 2015-176969 A | 10/2015 |
| JP | 2015-225939 A | 12/2015 |
| JP | 2015-226255 A | 12/2015 |
| JP | 2015-228468 A | 12/2015 |
| WO | 2009/133967 A2 | 11/2009 |
| WO | 2016/203974 A1 | 12/2016 |

* cited by examiner

IMAGING DEVICE AND IMAGING SYSTEM

CROSS-REFERENCE TO RELATED APPLICATION

This application is a Divisional of U.S. application Ser. No. 15/844,140, filed Dec. 15, 2017, which claims priority from Japanese Patent Application No. 2016-254360 filed Dec. 27, 2016, which are hereby incorporated by reference herein in their entireties.

BACKGROUND OF THE INVENTION

Field of the Invention

The present invention relates to an imaging device and an imaging system.

Description of the Related Art

An imaging device, such as that disclosed in Japanese Patent Laid-Open No. 2015-228468, is known. The imaging device includes a plurality of pixels, each including a photoelectric converter and a light guiding path that guides light to the photoelectric converter. Japanese Patent Laid-Open No. 2015-228468 describes a light guiding path that has different lengths in a first direction and a second direction orthogonal to the first direction.

Japanese Patent Laid-Open No. 2015-228468 does not discuss the layout of an exit surface of the light guiding path and a charge accumulation portion in plan view. Therefore, with the technique disclosed in Japanese Patent Laid-Open No. 2015-228468, it is difficult to sufficiently reduce the entry of light from the light guiding path into the charge accumulation portion.

SUMMARY OF THE INVENTION

The present invention has been made in view of the problem described above. An aspect of the present invention provides an imaging device that includes a plurality of pixels two-dimensionally arranged. Each of the pixels includes a photoelectric converter, a light guiding path disposed above the photoelectric converter and having an entrance surface and an exit surface, a charge accumulation portion to which electric charges are transferred from the photoelectric converter, and a floating diffusion portion to which electric charges are transferred from the charge accumulation portion. The photoelectric converter of a first pixel of the plurality of pixels and the photoelectric converter of a second pixel of the plurality of pixels are arranged along a first direction. At least part of the charge accumulation portion of the first pixel is disposed between the photoelectric converter of the first pixel and the photoelectric converter of the second pixel. The exit surface of the light guiding path of the first pixel is longer in a second direction orthogonal to the first direction in plan view than in the first direction.

Further features of the present invention will become apparent from the following description of exemplary embodiments with reference to the attached drawings.

DESCRIPTION OF THE EMBODIMENTS

Figure 1:
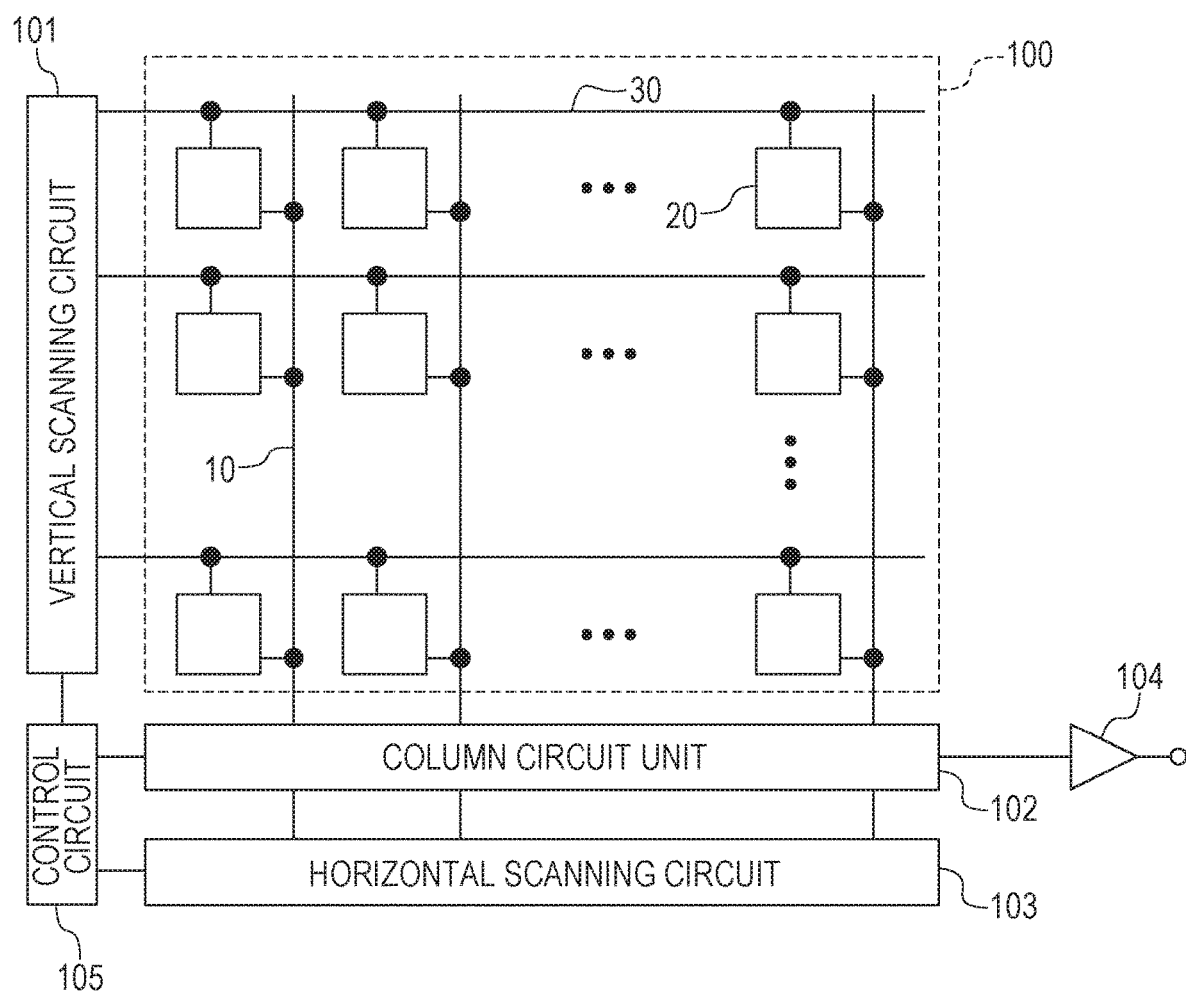
FIG. 1 illustrates a configuration of an imaging device according to a first embodiment.

Hereinafter, an imaging device according to embodiments of the present invention will be described, which is configured to sufficiently reduce the entry of light from a light guiding path into a charge accumulation portion.

Throughout the drawings, the same components are denoted by the same reference numerals. A redundant description of components may be omitted. The embodiments described below are for illustrative purposes, and the present invention is not limited to the embodiments described below.

First Embodiment (Configuration of Imaging Device)

FIG. 1 illustrates an imaging device according to a first embodiment. The imaging device of the present embodiment includes column signal lines 10 and pixels 20. In a pixel array 100, the pixels 20 are arranged in a plurality of rows and columns. The column signal lines 10 are arranged to correspond to the respective columns of the pixels 20. The imaging device further includes a vertical scanning circuit 101. The pixels 20 are connected row-by-row to the column signal lines 10 through control lines 30 such that a common signal is supplied from the vertical scanning circuit 101 to each row of pixels 20. The vertical scanning circuit 101 is a control unit that controls the accumulation period of the pixels 20.

The imaging device further includes a column circuit unit 102, a horizontal scanning circuit 103, and an output circuit 104. The column circuit unit 102 includes a plurality of column circuits, each of which corresponds to one of the plurality of column signal lines 10. The plurality of column circuits are each configured to output, to the output circuit 104, a signal obtained by amplifying a signal output to the corresponding column signal line 10.

The horizontal scanning circuit 103 is configured to sequentially select the plurality of column circuits of the column circuit unit 102. This causes the signals retained by the plurality of column circuits to be sequentially output to the output circuit 104. The output circuit 104 is configured to output signals to the outside of the imaging device. The signals output by the output circuit 104 are those output by the imaging device.

The imaging device further includes a control circuit 105. The control circuit 105 is connected to each of the vertical scanning circuit 101, the column circuit unit 102, and the horizontal scanning circuit 103 through a drive line for supplying a drive signal.

(Configuration of Pixels)

Figure 2:
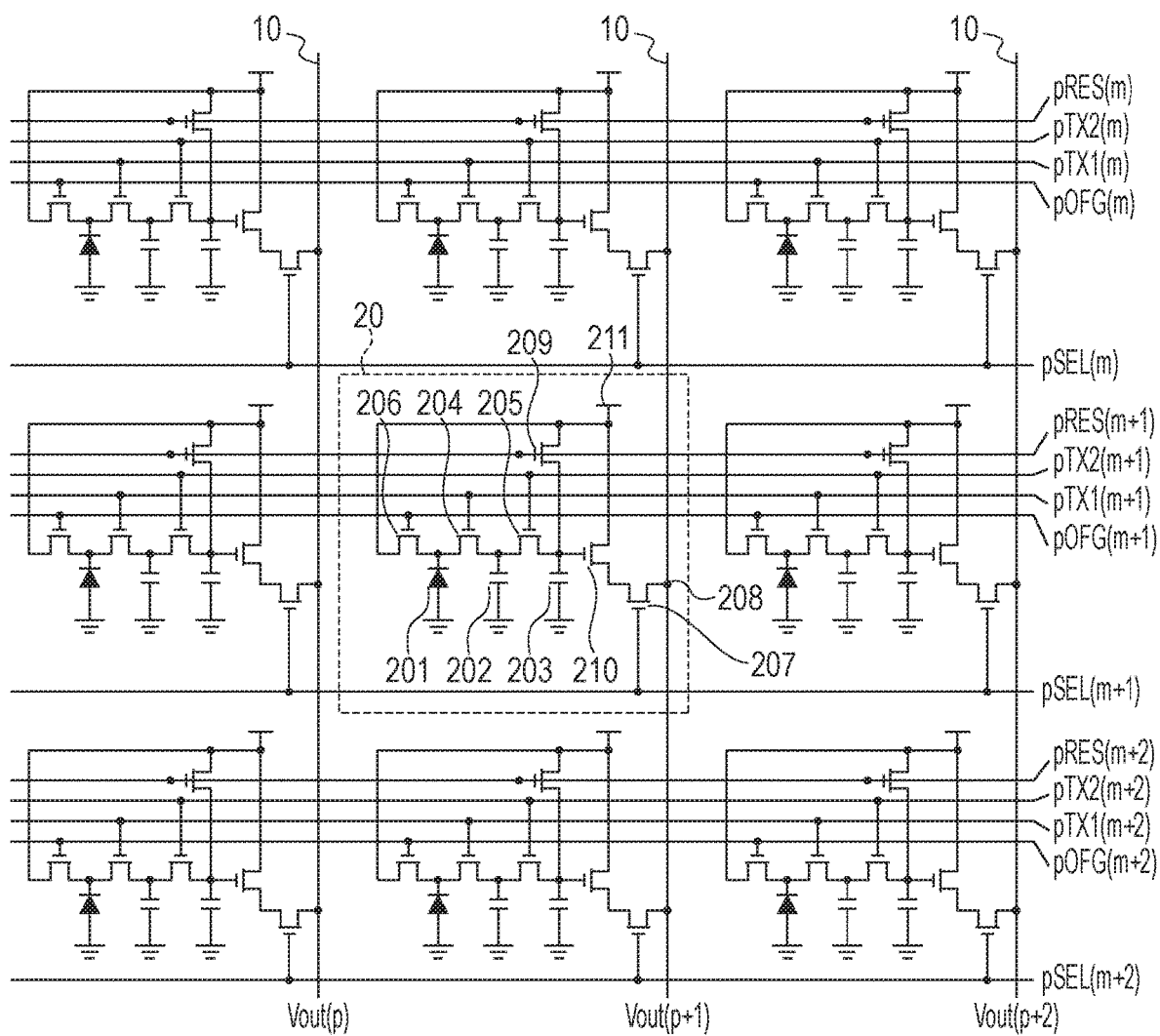
FIG. 2 illustrates a circuit configuration of pixels according to the first embodiment.

FIG. 2 illustrates a configuration of the pixels 20 in detail.

The pixels 20 each include a photodiode 201. The photodiode 201 is a photoelectric converter that generates a signal corresponding to incident light. The pixel 20 further includes a first transfer transistor 204 and a second transfer transistor 205. The pixel 20 further includes a capacitive element 202 and a floating diffusion (FD) portion 203. The capacitive element 202 is a charge accumulation portion that retains signals accumulated by the photodiode 201. The capacitive element 202, which serves as a charge accumulation portion, is electrically connected through the first transfer transistor 204 to the photodiode 201, which serves as a photoelectric converter. The FD portion 203 is electrically connected through the second transfer transistor 205 to the capacitive element 202, which serves as a charge accumulation portion.

The pixel 20 further includes a reset transistor 209, which is supplied with a source voltage from a voltage source 211. The reset transistor 209 is electrically connected to the FD portion 203.

The pixel 20 further includes an amplifying transistor 210 and a selecting transistor 207. The FD portion 203 is connected to the input node of the amplifying transistor 210. The amplifying transistor 210 is supplied with a source voltage from the voltage source 211. The amplifying transistor 210 is electrically connected through the selecting transistor 207 to the corresponding column signal line 10.

A current source (not shown) is electrically connected to the column signal line 10. When the selecting transistor 207 is in the ON state, the amplifying transistor 210 forms a source follower circuit with the source voltage supplied from the voltage source 211 and the current source electrically connected to the column signal line 10. In FIG. 2, a signal output to a corresponding one of the column signal lines 10 is denoted as signal Vout(p). Note that (p) at the end indicates a column number.

The pixel 20 further includes a PD reset transistor 206, which is supplied with a source voltage from the voltage source 211.

As illustrated in FIG. 1, the pixels 20 and the vertical scanning circuit 101 are electrically connected through the control lines 30. A signal pTX1(m) is input to the gate of the first transfer transistor 204. Hereinafter, (m) at the end indicates that the signal is input to the pixels 20 in the m-th row. Signals input to a plurality of rows of pixels 20 are collectively denoted without (m).

A signal pTX2(m) is input to the gate of the second transfer transistor 205.

A signal pOFG(m) is input to the gate of the PD reset transistor 206.

The signals pTX1 input to the plurality of rows of pixels 20 are brought to the active level at the same time, and brought to the non-active level at the same time. The signals pOFG input to the plurality of rows of pixels 20 are brought to the active level at the same time, and brought to the non-active level at the same time. The imaging device of the present embodiment thus performs a global electronic shutter operation in which the photodiodes 201 of all the pixels 20 start signal accumulation at the same time and end the signal accumulation at the same time.

A signal pRES(m) is input to the gate of the reset transistor 209.

A signal pSEL(m) is input to the gate of the selecting transistor 207.

(Layout of Light Guiding Path and Charge Accumulation Portion)

Figure 3A:
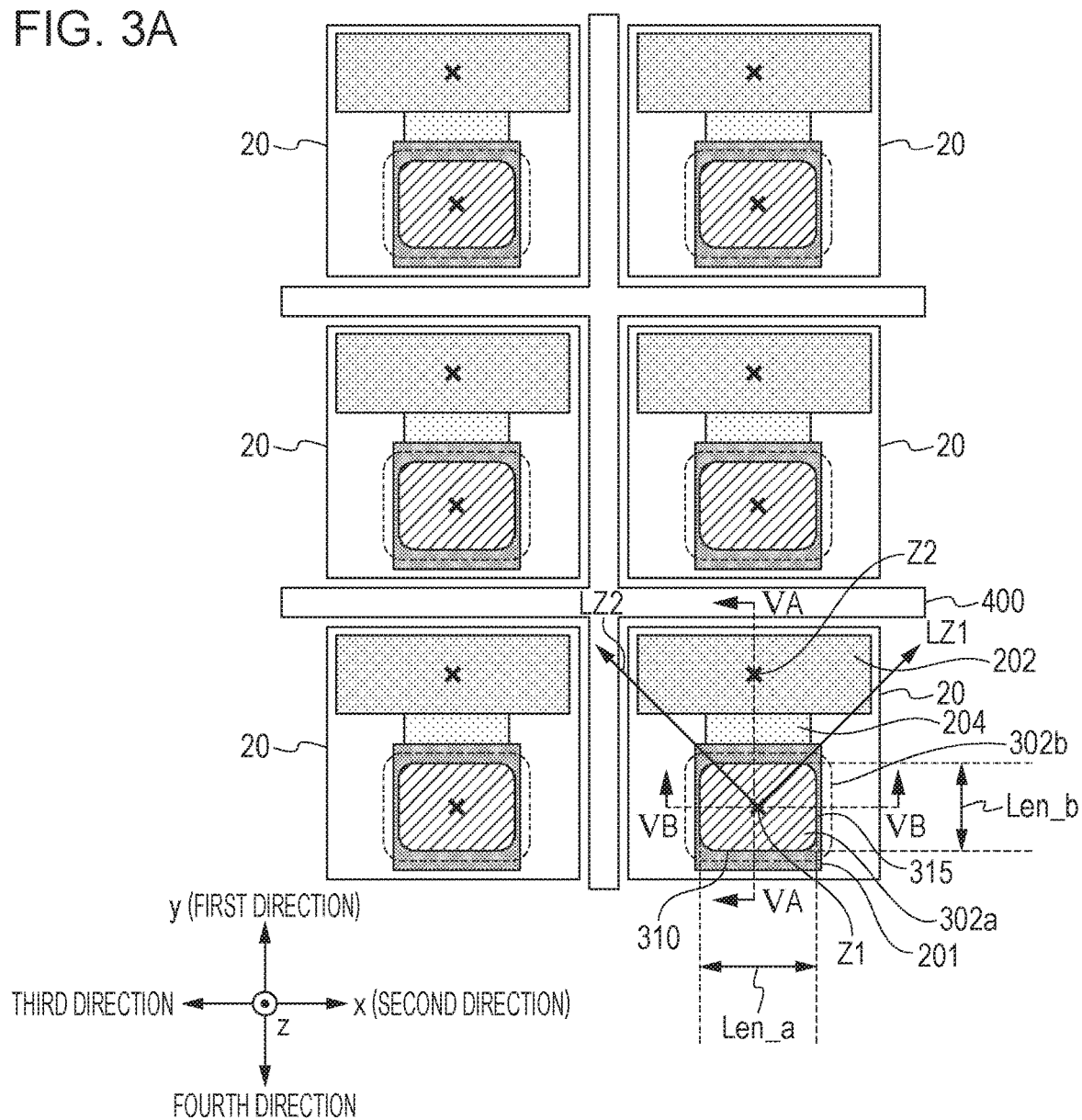
FIG. 3A is a plan view of a layout of some of the pixels illustrated in FIGS. 1 and 2.

FIG. 3A is a top view of some of the pixels 20 described with reference to FIGS. 1 and 2. FIG. 3A illustrates three rows by two columns of pixels 20.

Reference numerals in FIG. 3A correspond to those shown in FIG. 2. An exit plane 302a is a plane obtained by projecting, onto a semiconductor substrate 600 (see FIG. 5A) having the photodiode 201 therein, an exit surface 302x of a light guiding path 302 that guides light to the photodiode 201. The exit plane 302a can be regarded as being rectangular in shape. Similarly, an entrance plane 302b is a plane obtained by projecting, onto the semiconductor substrate 600 having the photodiode 201 therein, an entrance surface 302y of the light guiding path 302 that guides light to the photodiode 201. The exit plane 302a has a length Len_b in the y direction, which is a first direction in plan view. The exit plane 302a also has a length Len_a in the x direction, which is a second direction orthogonal to the first direction in plan view. The length Len_b is shorter than the length Len_a. Since the exit plane 302a is a plane obtained by projecting the exit surface 302x onto the semiconductor substrate 600, the length Len_b of the exit surface 302x is also shorter than the length Len_a thereof.

An element isolation region 400 is formed between adjacent pixels 20. The element isolation region 400 may be formed using a local oxidation of silicon (LOCOS) technique. A shallow trench isolation (STI) technique may be used to form the element isolation region 400. The element isolation region 400 may be formed using a PN junction, or may be formed using various other techniques.

Figure 4:
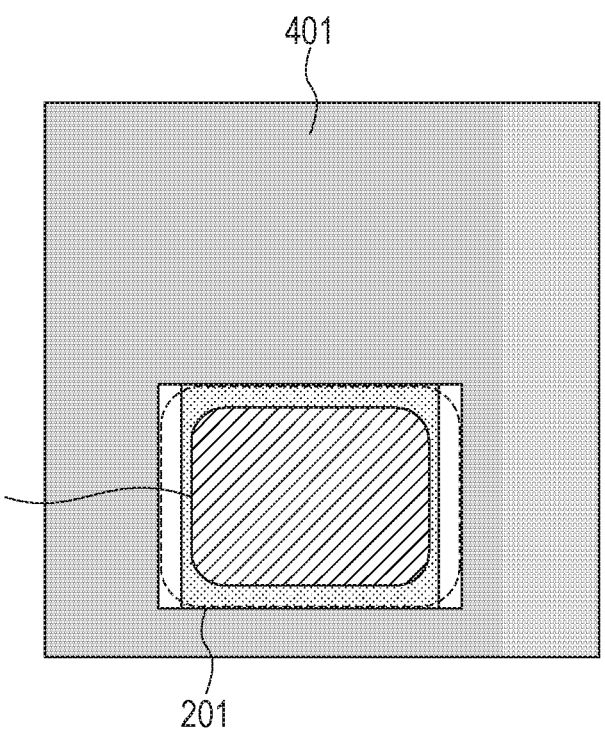
FIG. 4 is a plan view of a layout of one of the pixels illustrated in FIG. 3A.
Figure 4:
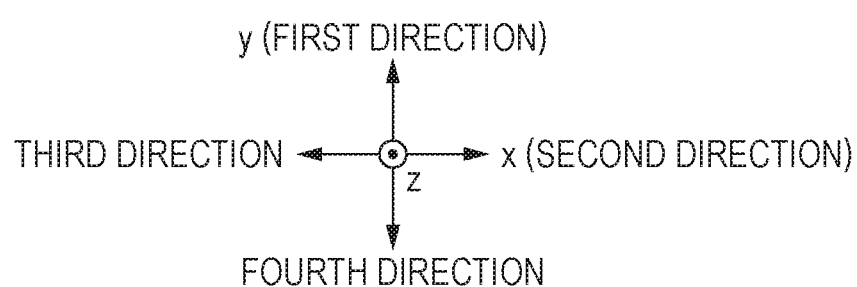

FIG. 4 is a plan view of one of the pixels 20 in FIG. 3A, as viewed from an upper layer (entrance surface side). A region outside the photodiode 201 is shielded from light by a light shielding portion 401 of the pixel 20. The photodiode 201 is provided with an aperture on the upper side thereof (see also FIG. 5A) where the light shielding portion 401 is absent. A long side of the aperture is parallel to the long side of the exit plane 302a, and a short side of the aperture is parallel to the short side of the exit plane 302a. A component capable of blocking light, such as a tungsten member, may be used as the light shielding portion 401.

(Cross-Sectional View of Pixel)

Figure 5A:
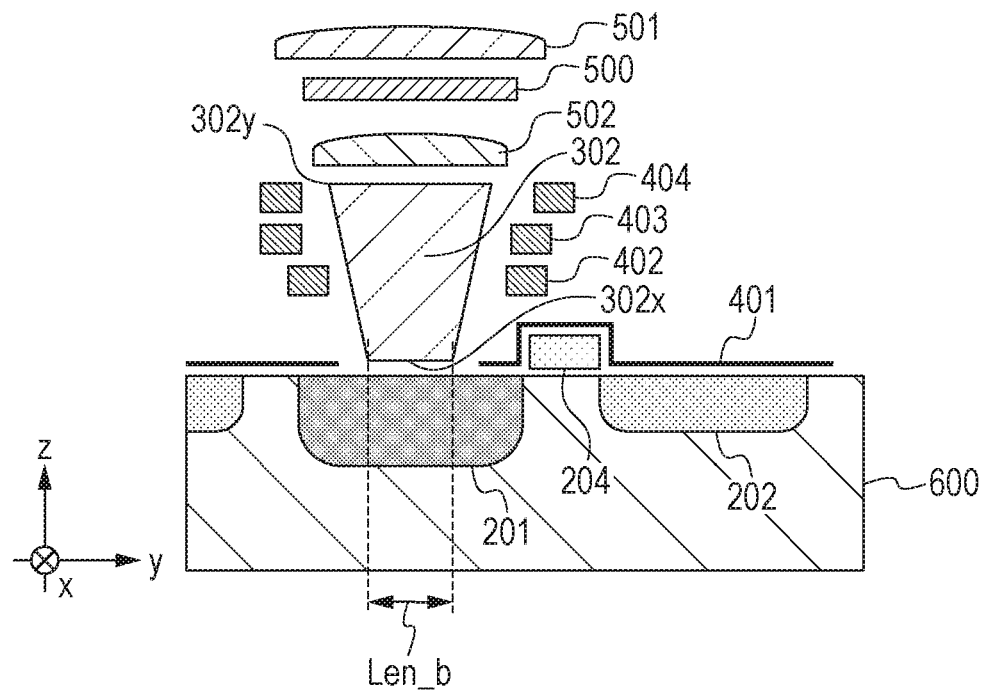
FIGS. 5A and 5B each illustrate a cross-sectional structure of one of the pixels illustrated in FIG. 3A.
Figure 5B:
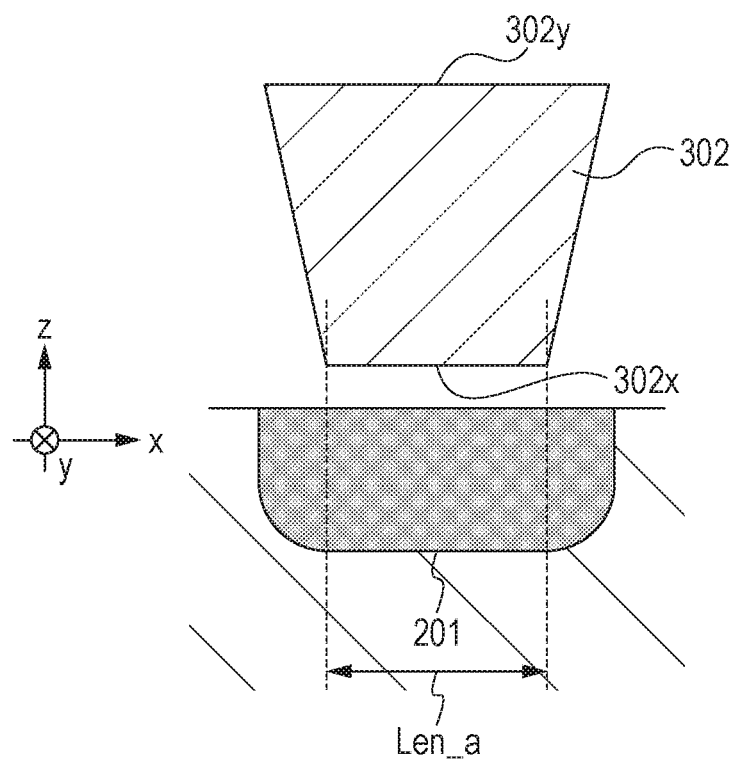

FIGS. 5A and 5B each illustrate a cross-sectional structure of one of the pixels 20 illustrated in FIG. 3A.

FIG. 5A is a cross-sectional view taken along line VA-VA of FIG. 3A.

The photodiode 201 and the capacitive element 202 are formed in the semiconductor substrate 600.

The capacitive element 202 and the first transfer transistor 204 are shielded from light by the light shielding portion 401.

An interlayer insulating layer (not shown) is formed between adjacent ones of a line 402, a line 403, and a line 404. A silicon dioxide (SiO) film with a refractive index of about 1.5 is used as the interlayer insulating layer.

The light guiding path 302 is disposed above the photodiode 201. The light guiding path 302 has the entrance surface 302y and the exit surface 302x.

The pixel 20 further includes a color filter 500, a microlens 501, and an interlayer lens 502. Light transmitted through the microlens 501, the color filter 500, and the interlayer lens 502 enters the entrance surface 302y.

The length of the exit surface 302x in the first direction is the length Len_b.

FIG. 5B is a cross-sectional view taken along line VB-VB of FIG. 3A. The length of the exit surface 302x in the second direction is the length Len_a. The length Len_b is shorter than the length Len_a.

A silicon oxynitride (SiON) film with a refractive index of about 1.8 is used as the light guiding path 302. Light originating from the inside of the light guiding path 302 and entering the interface between the light guiding path 302 and the interlayer insulating layer at a predetermined angle is entirely reflected back to the inside of the light guiding path 302. The light guiding path 302 can thus guide light entering the entrance surface 302y to the exit surface 302x while reducing leakage of light to the interlayer insulating layer.

With the light guiding path 302, the amount of light entering the photodiode 201 is larger than that in the case without the light guiding path 302. This means that with the light guiding path 302, the sensitivity of the photodiode 201 is greater than that in the case without the light guiding path 302.

However, light may leak out of the light guiding path 302 to the interlayer insulating layer. If the leaking light enters the capacitive element 202, electric charges are newly generated from the light in the capacitive element 202. When the capacitive element 202 retains electric charges generated by the photodiode 201, the electric charges newly generated in the capacitive element 202 are those generated in a time period different from that when the photodiode 201 generated the electric charges retained. Therefore, the quality of an image obtained when the capacitive element 202 generates electric charges becomes lower than that of an original image, due to mixing of signals of a time period different from an original charge generation period of the photodiode 201.

To reduce the entry of light from the light guiding path 302 into the capacitive element 202, the imaging device of the present embodiment is developed, which takes into account the layout of the light guiding path 302 and the capacitive element 202.

To reduce the entry of light from the light guiding path 302 into the capacitive element 202, it is desirable to maximize the distance between the exit plane 302a obtained by projecting the exit surface 302x onto the semiconductor substrate 600 and the capacitive element 202, under the size constraint of the pixel 20. Specifically, the capacitive element 202 is disposed such that the center of gravity thereof is located in a region between a first line and a second line both extending from the center of gravity of the exit plane 302a. The first line divides the angle between the first direction and the second direction into two equal parts, and the second line divides the angle between a third direction opposite the second direction and the first direction into two equal parts.

This will be described with reference to FIG. 3A. A first line LZ1 is a bisector that extends from a center of gravity Z1 of the exit plane 302a in plan view and divides the angle between the first direction and the second direction into two equal parts. A second line LZ2 is a bisector that also extends from the center of gravity Z1 of the exit plane 302a in plan view and divides the angle between the third direction opposite the second direction and the first direction into two equal parts. A center of gravity Z2 of the capacitive element 202 is located in the region between the first line LZ1 and the second line LZ2.

In another respect, the capacitive element 202 is disposed closer to a long side 310 than to a short side 315 of the exit plane 302a, which is obtained by projecting the exit surface 302x of the light guiding path 302 onto the semiconductor substrate 600. More specifically, the capacitive element 202 is disposed between the long side 310 of the exit plane 302a and the element isolation region 400 formed between the long side 310 and the pixel 20 adjacent thereto in the first direction. The long sides 310 of the exit plane 302a have a length extending in the second direction and longer than the short sides 315 of the exit plane 302a.

Figure 3B:
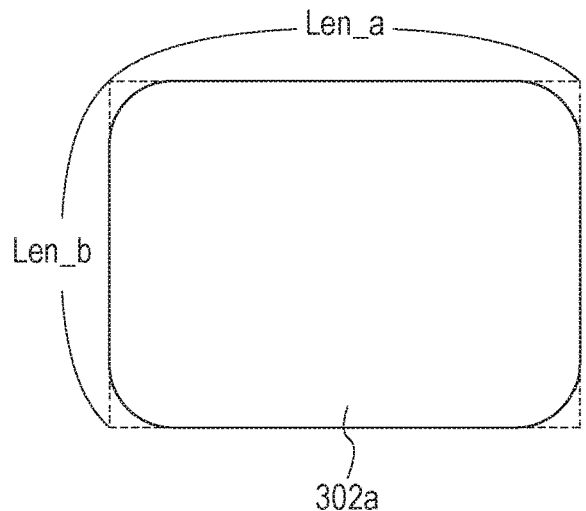
FIG. 3B illustrates dimensions of an exit plane of one of the pixels illustrated in FIG. 3A.

A method of defining the length of each side of the exit surface 302x when the exit surface 302x is not rectangular (e.g., when each corner of the rectangle has a curvature) will be described. In this case, as illustrated in FIG. 3B, a first side of the exit surface 302x (exit plane 302a) and a second side of the exit surface 302x extending in a direction intersecting the first side are both extended beyond the corresponding corner having a curvature. Similarly, a third side and a fourth side extending in a direction intersecting the third side are both extended beyond the corresponding corner having a curvature. The distance between two adjacent points of intersection can thus be treated as the length of each side.

In another respect, the photodiode 201 of a first pixel and the photodiode 201 of a second pixel are arranged along the first direction. The capacitive element 202 of the first pixel is disposed between the photodiode 201 of the first pixel and the photodiode 201 of the second pixel. The exit surface 302x of the light guiding path 302 of the first pixel is larger in length Len_a in the second direction orthogonal to the first direction in plan view than in length Len_b in the first direction.

The second direction may not coincide with the direction of the long sides of the exit surface 302x. In this case, the largest length of the exit surface 302x in the second direction can be defined as the length of the long sides. Similarly, the first direction may not coincide with the direction of the short sides of the exit surface 302x. In this case, the largest length of the exit surface 302x in the first direction can be defined as the length of the short sides.

Figure 6A:
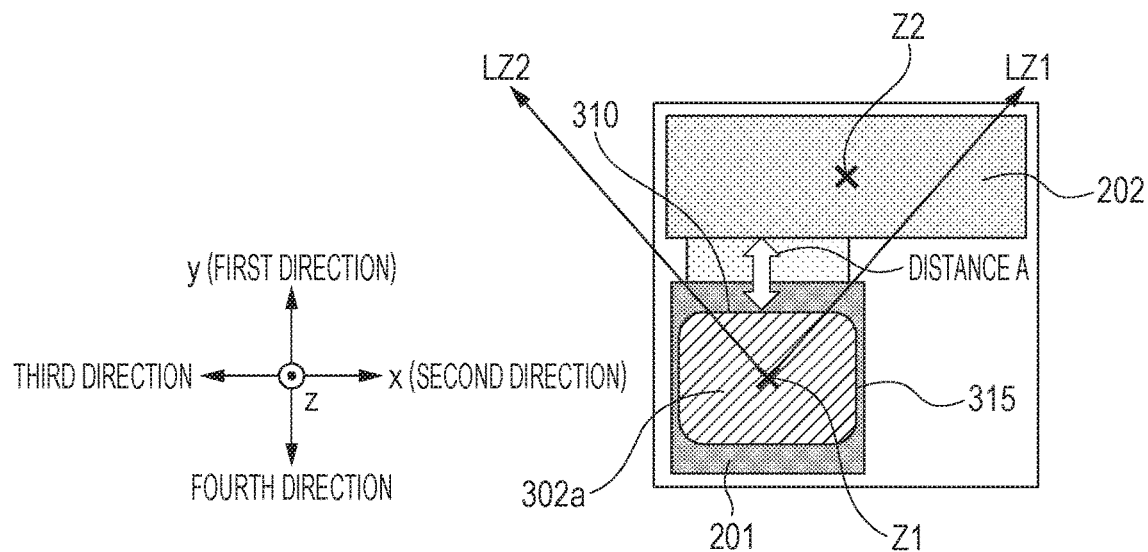
FIGS. 6A and 6B are plan views each illustrating a layout of a pixel.
Figure 6B:
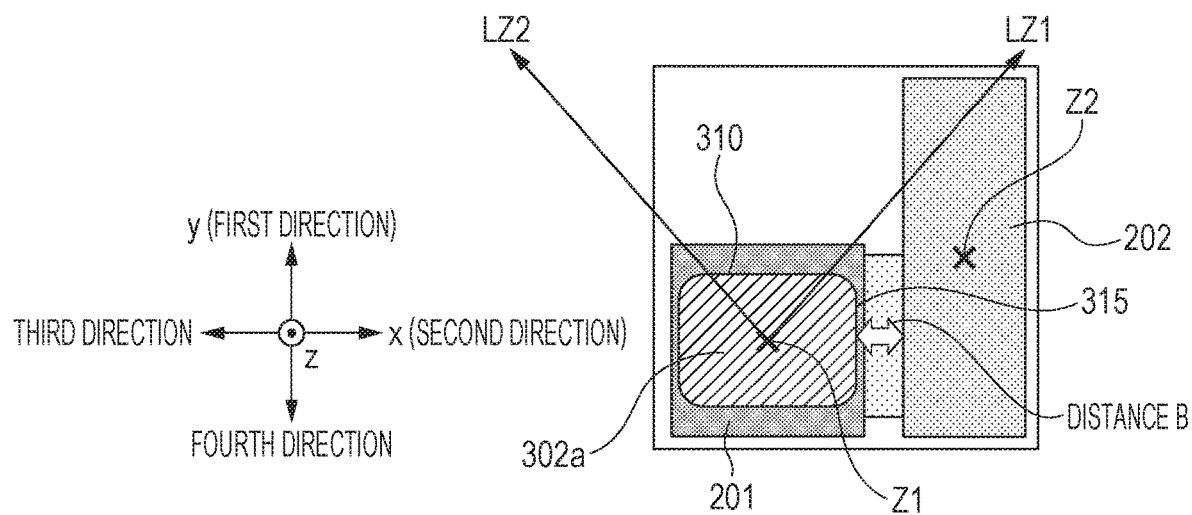

FIGS. 6A and 6B are plan views each illustrating a layout of the photodiode 201, the capacitive element 202, and the exit plane 302a.

FIG. 6A illustrates an example in which, as in FIG. 3A, the center of gravity Z2 of the capacitive element 202 is located in the region between the first line LZ1 and the second line LZ2. On the other hand, FIG. 6B illustrates an example in which the center of gravity Z2 of the capacitive element 202 is not located in the region between the first line LZ1 and the second line LZ2.

In another respect, FIG. 6A illustrates an example in which the capacitive element 202 is disposed between the element isolation region 400 formed between the pixels 20 adjacent in the first direction and the long side 310. On the other hand, FIG. 6B illustrates an example in which the capacitive element 202 is disposed between the element isolation region 400 formed between the pixels 20 adjacent in the second direction and the short side 315.

In FIG. 6A, the distance between the capacitive element 202 and the exit plane 302a is denoted as distance A. In FIG. 6B, the distance between the capacitive element 202 and the exit plane 302a is denoted as distance B. The distance A is larger than the distance B.

In FIG. 6A, the capacitive element 202 is disposed such that the center of gravity Z2 thereof is located in the region between the first line LZ1 and the second line LZ2. Thus, as compared to the case of the layout of FIG. 6B, where the center of gravity Z2 of the capacitive element 202 is located outside the region between the first line LZ1 and the second line LZ2, the capacitive element 202 can be disposed farther from the exit surface 302x of the light guiding path 302.

In another respect, when the capacitive element 202 is disposed between the element isolation region 400 formed between the pixels 20 adjacent in the first direction and the long side 310, the capacitive element 202 can be made farther from the exit surface 302x of the light guiding path 302 than in the layout illustrated in FIG. 6B.

This can reduce the amount of light entering from the light guiding path 302 into the capacitive element 202. Thus, as compared to the case in which the capacitive element 202 is disposed closer to the short side 315 of the exit plane 302a, a degradation in image quality caused by the entry of light from the light guiding path 302 into the capacitive element 202 can be reduced.

To increase the amount of light entering the photodiode 201, that is, to increase the sensitivity of the photodiode 201, it is desirable to increase the area of the exit surface 302x. However, increasing the area of the exit surface 302x leads to an increased amount of light entering the capacitive element 202. With the above-described layout of the present embodiment, where the capacitive element 202 is distant from the exit surface 302x, it is possible to achieve both improved sensitivity and reduced degradation of image quality.

Although the pixels 20 are arranged along both the first and second directions of the exit plane 302a in the present embodiment, the arrangement of the pixels 20 is not limited to this. The pixels 20 may be arranged along any directions which include a direction corresponding to the first direction and a direction corresponding to the second direction. For example, a direction corresponding to the first direction is a direction closer to the first direction than to the second direction, and typically forms an angle within a range of plus or minus 10 degrees from the first direction.

The structure of the capacitive element 202 is not limited to that of the present embodiment. For example, the capacitive element 202 may be a polysilicon-insulator-polysilicon (PiP) capacitor formed by a plurality of polysilicon layers with an insulating layer therebetween.

Second Embodiment

An imaging device according to a second embodiment will be described mainly about differences from the first embodiment.

Figure 7A:
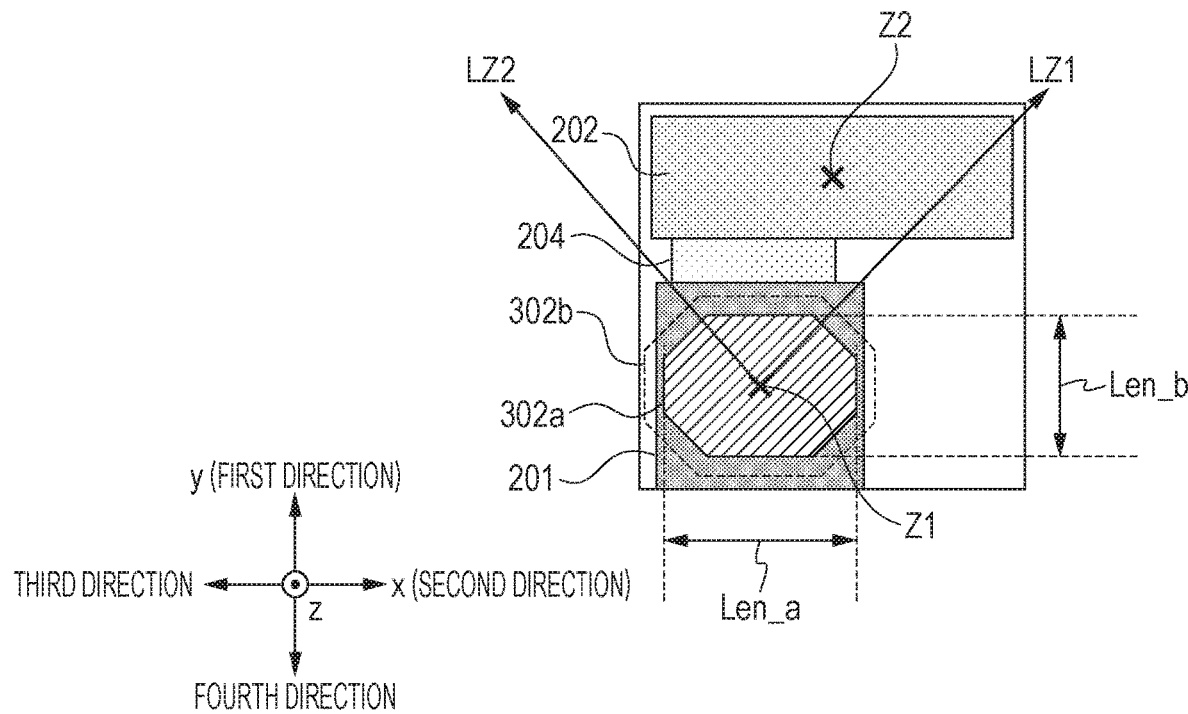
FIGS. 7A and 7B are plan views each illustrating a layout of a pixel according to a second embodiment.
Figure 7B:
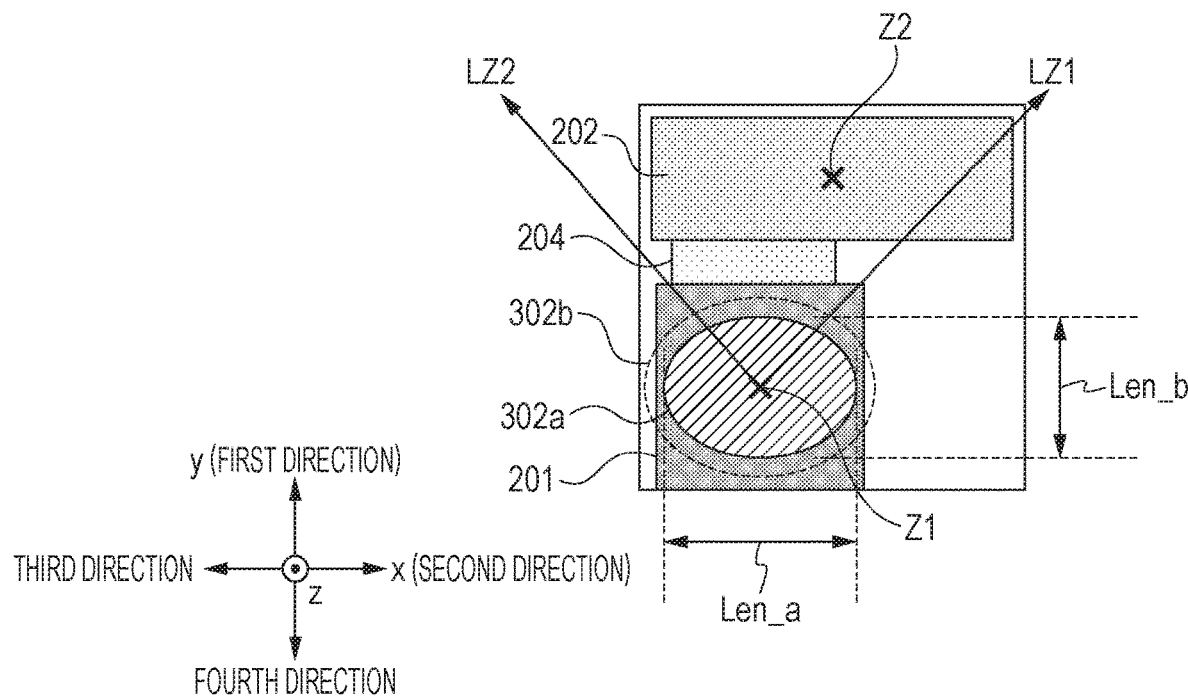

FIG. 7A illustrates an example where the exit plane 302a described with reference to FIG. 3A is in the shape of a hexagon, which is an example of a polygon. FIG. 7B illustrates an example where the exit plane 302a is in the shape of an ellipse. The entrance plane 302b is geometrically similar to, and greater in size than, the exit plane 302a.

In FIG. 7A, the length Len_a represents the length of the longest of the diagonals each connecting two nonadjacent vertices of the hexagon, and the length Len_b represents the length of the diagonals orthogonal to the longest diagonals of the hexagon. The length Len_b is shorter than the length Lena.

In FIG. 7A, the center of gravity Z2 of the capacitive element 202 is also located in the region between the first line LZ1 and the second line LZ2.

In another respect, in the example of FIG. 7A, the capacitive element 202 is disposed between the longest diagonal of the exit plane 302a extending in the second direction and the element isolation region 400 (see the first embodiment) extending in a direction corresponding to the second direction.

In another respect, the photodiode 201 of the first pixel and the photodiode 201 of the second pixel are arranged along the first direction. The capacitive element 202 of the first pixel is disposed between the photodiode 201 of the first pixel and the photodiode 201 of the second pixel. In the exit surface 302x of the light guiding path 302 of the first pixel, the length of the longest diagonals in the second direction is longer than the length of the diagonals in the first direction orthogonal to the longest diagonals. The second direction may not coincide with the direction of the diagonals of the exit surface 302x. In this case, the largest length of the exit surface 302x in the second direction can be defined as the length of the diagonals. Similarly, the first direction may not coincide with the direction of the diagonals of the exit surface 302x. In this case, the largest length of the exit surface 302x in the first direction can be defined as the length of the diagonals.

Thus, as in the first embodiment, it is possible to achieve both improved sensitivity and reduced degradation of image quality.

In FIG. 7B, the length Lena and the length Len_b represent the lengths of the major axis and the minor axis, respectively, of the exit plane 302a having an elliptical shape. The length Len_b is shorter than the length Len_a.

In FIG. 7B, the center of gravity Z2 of the capacitive element 202 is also located in the region between the first line LZ1 and the second line LZ2.

In another respect, in the example of FIG. 7B, the capacitive element 202 is disposed between the major axis of the exit plane 302a extending in the second direction and the element isolation region 400 (see the first embodiment) extending in a direction corresponding to the second direction.

In another respect, the photodiode 201 of the first pixel and the photodiode 201 of the second pixel are arranged along the first direction. The capacitive element 202 of the first pixel is disposed between the photodiode 201 of the first pixel and the photodiode 201 of the second pixel. In the exit surface 302x of the light guiding path 302 of the first pixel, the length of the major axis in the second direction orthogonal to the first direction in plan view is longer than the length of the minor axis in the first direction. The second direction may not coincide with the direction of the major axis of the exit surface 302x. In this case, the largest length of the exit surface 302x in the second direction can be defined as the length of the exit surface 302x in the second direction. Similarly, the first direction may not coincide with the direction of the minor axis of the exit surface 302x. In this case, the largest length of the exit surface 302x in the first direction can be defined as the length of the exit surface 302x in the first direction.

Thus, as in the first embodiment, it is possible to achieve both improved sensitivity and reduced degradation of image quality.

Third Embodiment

An imaging device according to a third embodiment will be described mainly about differences from the second embodiment.

In the imaging device of the second embodiment, the entrance plane 302b is geometrically similar to the exit plane 302a. In the imaging device of the present embodiment, the entrance plane 302b and the exit plane 302a are not geometrically similar.

Figure 8A:
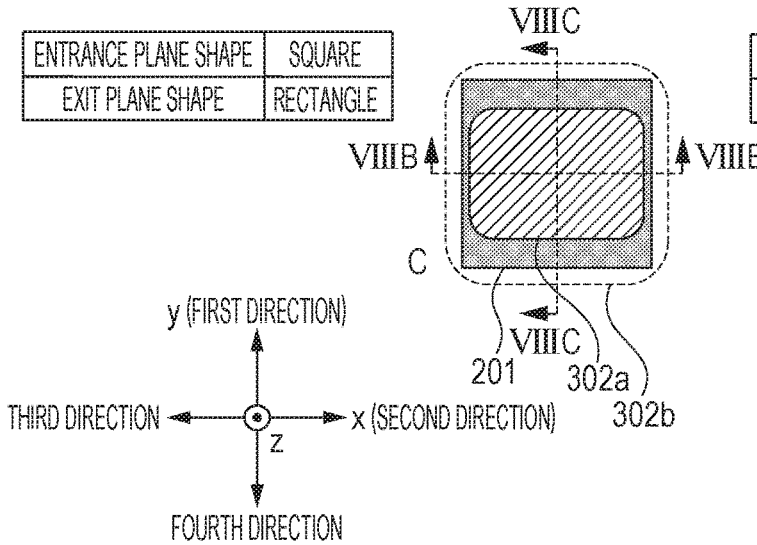
FIGS. 8A, 8D, and 8E are plan views each illustrating a layout of part of a pixel according to a third embodiment.

FIG. 8A illustrates an example where the entrance plane 302b is square in shape and the exit plane 302a is rectangular in shape.

Figure 8D:
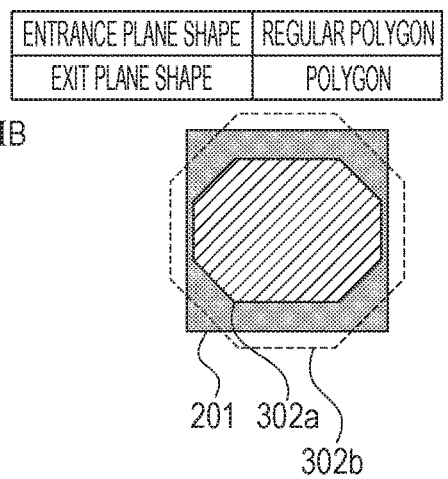
Figure 8B:
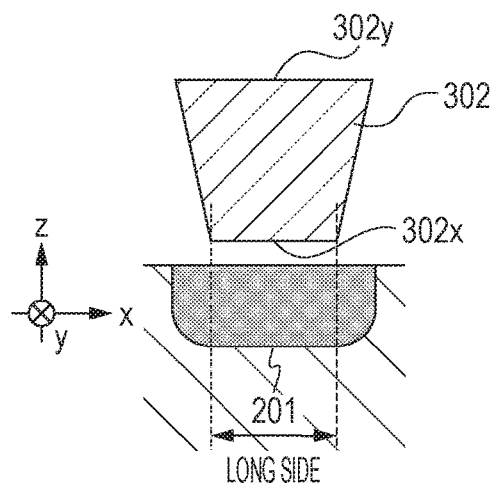
FIGS. 8B and 8C are cross-sectional views of FIG. 8A.
Figure 8E:
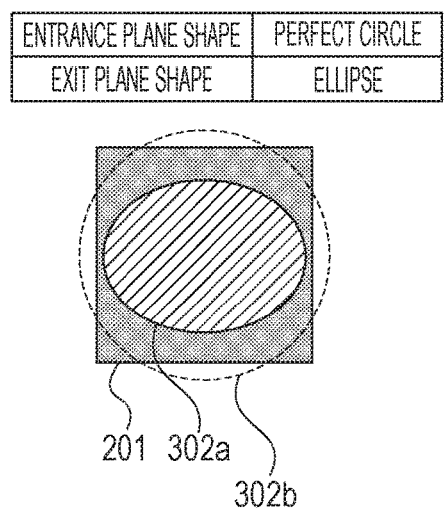
Figure 8C:
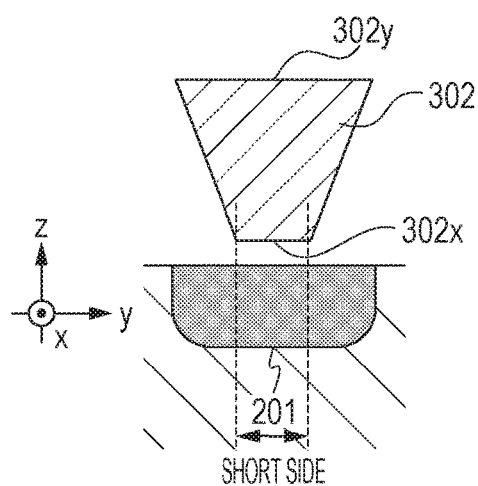

FIG. 8B is a cross-sectional view taken along line VIIIB-VIIIB of FIG. 8A and shows a plane parallel to the x direction (second direction). FIG. 8C is a cross-sectional view taken along line VIIIC-VIIIC of FIG. 8A and shows a plane parallel to the y direction (first direction). A comparison between FIGS. 8B and 8C shows that the taper angle of the light guiding path 302 in FIG. 8B is steeper than that in FIG. 8C. That is, the taper angle of the light guiding path 302 in the plane parallel to the second direction is steeper than the taper angle of the light guiding path 302 in the plane parallel to the first direction. The leakage of light from the side face of the light guiding path 302 into the interlayer insulating layer is reduced as the taper angle becomes steeper. The imaging device of the present embodiment is configured such that the taper angle of the light guiding path 302 is steeper on the side with the capacitive element 202 than that on the side without the capacitive element 202. Thus, in the imaging device of the present embodiment, the entry of light from the side face of the light guiding path 302 into the capacitive element 202 can be made less than that in the case where the entrance plane 302b is geometrically similar to the exit plane 302a.

FIG. 8D illustrates the entrance plane 302b having a regular polygonal shape and the exit plane 302a having a polygonal shape. FIG. 8E illustrates the entrance plane 302b having a perfect circular shape and the exit plane 302a having an elliptical shape. In both FIGS. 8D and 8E, the taper angle of the light guiding path 302 is steeper on the side with the capacitive element 202 than that on the side without the capacitive element 202. Thus, in the imaging device including the light guiding path 302 having the shape of either FIG. 8D or 8E, the entry of light from the side face of the light guiding path 302 into the capacitive element 202 can be made less than that in the case where the entrance plane 302b is geometrically similar to the exit plane 302a.

Fourth Embodiment

Figure 9:
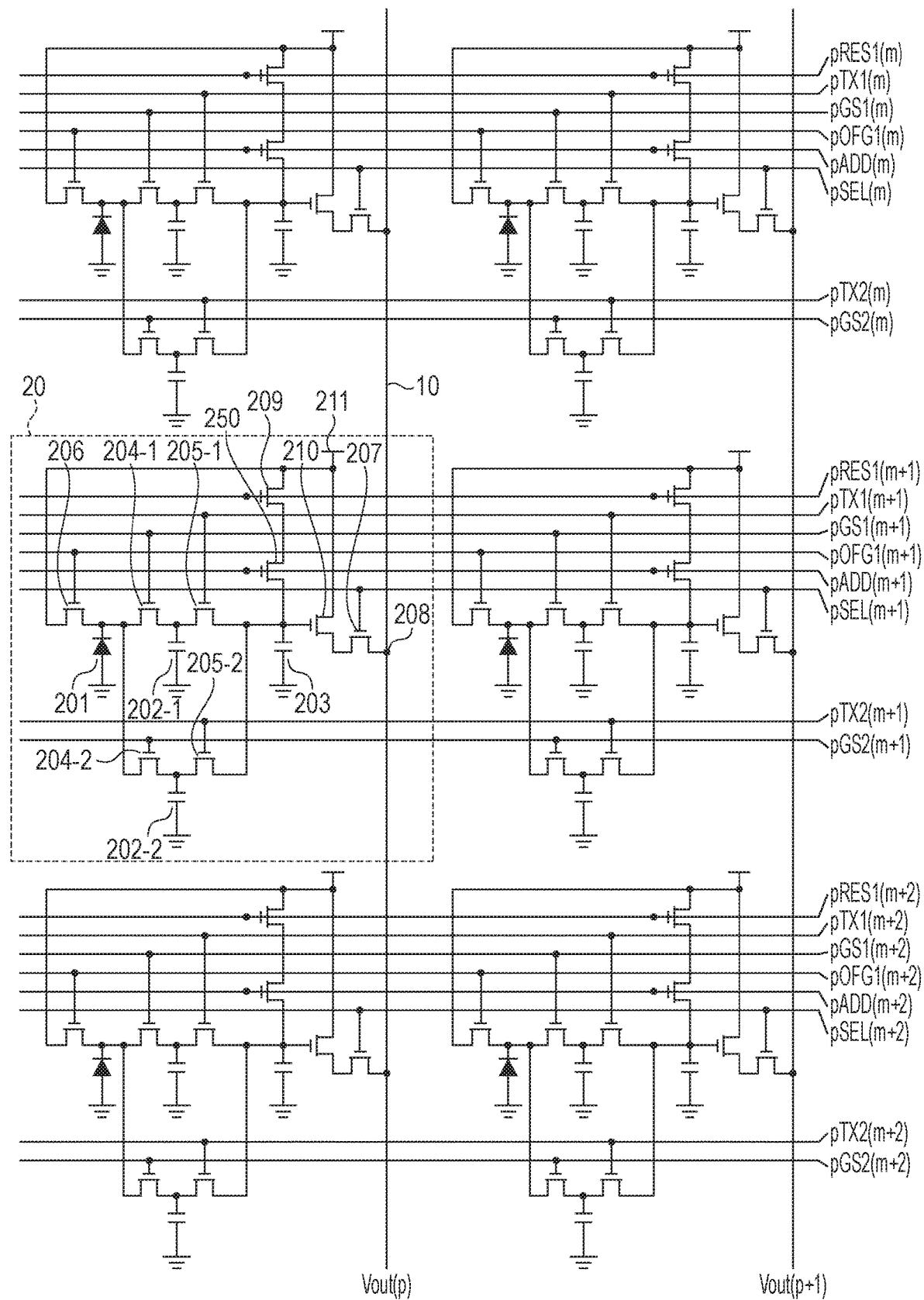
FIG. 9 illustrates a circuit configuration of pixels according to a fourth embodiment.

FIG. 9 is a circuit diagram of the pixels 20 of an imaging device according to a fourth embodiment. The pixels 20 of the imaging device according to the present embodiment each include a capacitive element 202-1 connected through a transistor 204-1 to the photodiode 201, and a capacitive element 202-2 connected through a transistor 204-2 to the photodiode 201. The capacitive element 202-1 is connected through a transistor 205-1 to the FD portion 203. The capacitive element 202-2 is connected through a transistor 205-2 to the FD portion 203.

A transistor 250 is connected to the FD portion 203. When a signal pADD input to the gate of the transistor 250 is brought to the active level, the transistor 250 is turned on. Then, a combined capacitor formed by the capacitance of the transistor 250 and the capacitance of the FD portion 203 is connected to the amplifying transistor 210. That is, the capacitor connected to the amplifying transistor 210 can be changed by turning on and off the transistor 250. Thus, each pixel 20 of the present embodiment can change a charge-to-voltage conversion coefficient used to convert electric charges transferred to the FD portion 203 into a gate voltage of the amplifying transistor 210.

Figure 10A:
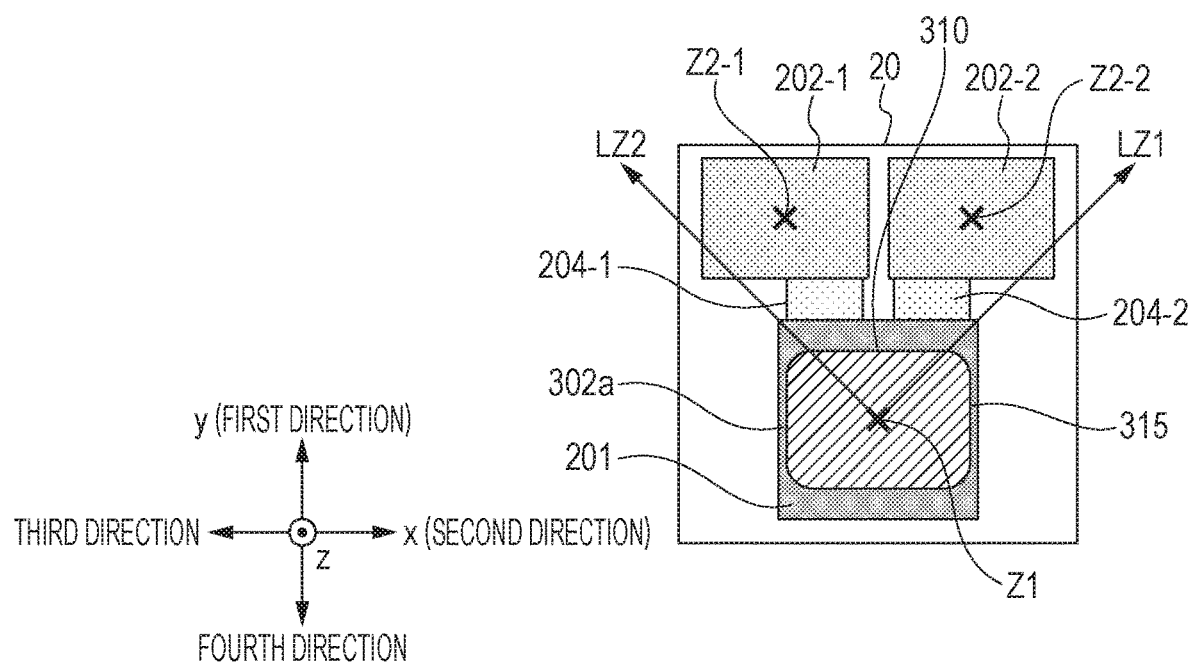
FIGS. 10A and 10B are plan views each illustrating a layout of a pixel according to the fourth embodiment.
Figure 10B:
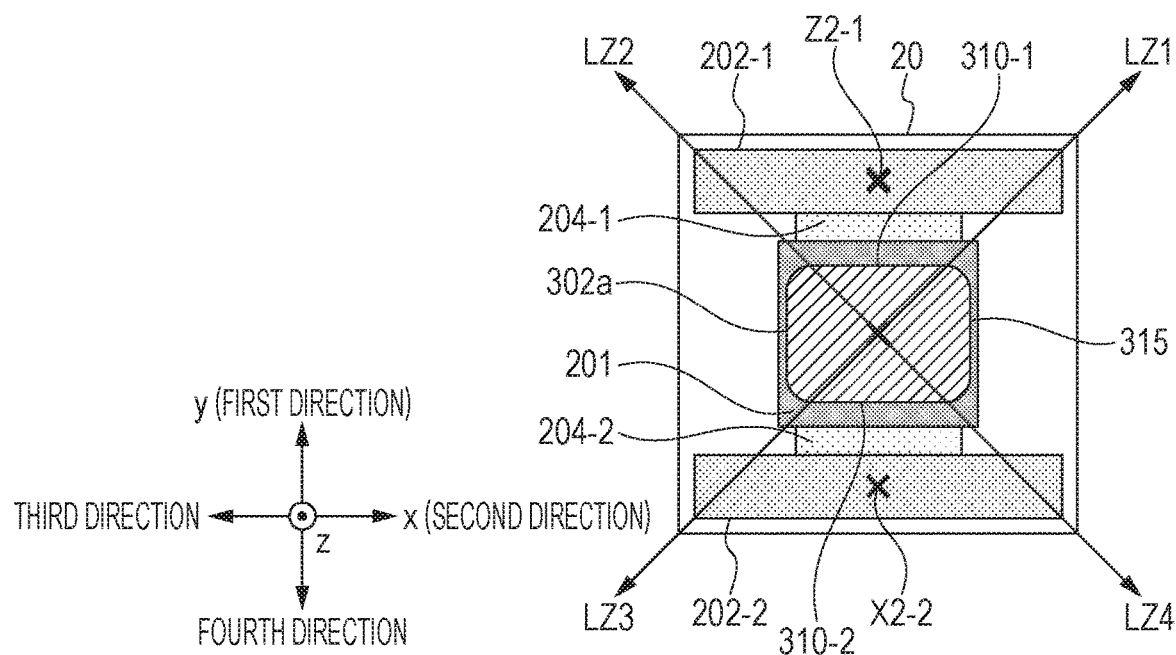

FIGS. 10A and 10B each illustrate a layout of the capacitive element 202-1, the capacitive element 202-2, and the exit plane 302a. Reference numerals shown in FIGS. 10A and 10B correspond to those in FIG. 9. In FIG. 10A, the capacitive element 202-1 and the capacitive element 202-2 are arranged along the second direction. In FIG. 10A, a center of gravity Z2-1 of the capacitive element 202-1 and a center of gravity Z2-2 of the capacitive element 202-2 are both located in the region between the first line LZ1 and the second line LZ2.

In another respect, in the example of FIG. 10A, the capacitive element 202-1 and the capacitive element 202-2 are disposed between the long side 310 of the exit plane 302a extending in the second direction and the element isolation region 400 (see the first embodiment) extending in a direction corresponding to the second direction.

Thus, the imaging device that includes the pixel 20 of FIG. 10A, including the two capacitive elements 202-1 and 202-2, can also achieve both improved sensitivity and reduced degradation of image quality.

In FIG. 10B, the capacitive element 202-1 and the capacitive element 202-2 are arranged along the first direction. The center of gravity Z2-1 of the capacitive element 202-1 is located in the region between the first line LZ1 and the second line LZ2.

A third line LZ3 is a bisector that divides the angle between a fourth direction opposite the first direction and the third direction opposite the second direction into two equal parts. A fourth line LZ4 is a bisector that divides the angle between the fourth direction opposite the first direction and the second direction into two equal parts. The center of gravity Z2-2 of the capacitive element 202-2 is located in the region between the third line LZ3 and the fourth line LZ4.

In another respect, in the example of FIG. 10B, the capacitive element 202-1 is disposed between the element isolation region 400 (see the first embodiment) formed between the pixels 20 adjacent in the first direction and extending in a direction corresponding to the second direction, and a long side 310-1 of the exit plane 302a extending in the second direction. Similarly, the capacitive element 202-2 is disposed between the element isolation region 400 (see the first embodiment) formed between the pixels 20 adjacent in the fourth direction and extending in a direction corresponding to the second direction, and a long side 310-2 of the exit plane 302a extending in the second direction. The long side 310-1 and the long side 310-2 are opposite sides.

In another respect, the pixels 20 each including the light guiding path 302 of the present embodiment can also be two-dimensionally arranged as illustrated in FIG. 3A. The photodiode 201 of the first pixel and the photodiode 201 of the second pixel are arranged along the first direction. In the example of FIG. 10A, the capacitive element 202-1 and the capacitive element 202-2 of the first pixel are disposed between the photodiode 201 of the first pixel and the photodiode 201 of the second pixel.

In the example of FIG. 10B, the photodiode 201 of the first pixel and the photodiode 201 of a third pixel are arranged along the fourth direction opposite the first direction. The capacitive element 202-2 of the first pixel is disposed between the photodiode 201 of the first pixel and the photodiode 201 of the third pixel. The capacitive element 202-1 of the first pixel is disposed between the photodiode 201 of the first pixel and the photodiode 201 of the second pixel.

Thus, the imaging device that includes the pixel 20 of FIG. 10B, including the two capacitive elements 202-1 and 202-2, can also achieve both improved sensitivity and reduced degradation of image quality.

The imaging device of the present embodiment includes the capacitive element 202-1 and the capacitive element 202-2. The imaging device is capable of performing an operation in which electric charges accumulated by the photodiode 201 during a charge accumulation period for an n-th frame are retained by the capacitive element 202-1, and electric charges accumulated by the photodiode 201 during a charge accumulation period for an (n+1)-th frame are retained by the capacitive element 202-2. Thus, before completion of the output of a signal of the n-th frame for all the rows of pixels 20, the electric charges accumulated in the (n+1)-th frame by the photodiode 201 can be output to the capacitive element 202-2. Thus, it is possible to eliminate, between the n-th frame and the (n+1)-th frame, a period during which no electric charges are accumulated by the photodiode 201. Also, with the capacitive element 202-2 of the pixel 20, in the accumulation of electric charges by the photodiode 201 during the period of the (n+1)-th frame, the photodiode 201 can generate electric charges while transferring the electric charges to the capacitive element 202-2. This allows electric charges exceeding the saturation capacitance of the photodiode 201 to be retained in the capacitive element 202-2. Electric charges accumulated by the photodiode 201 during the charge accumulation period for the (n+1)-th frame can be retained in the capacitive element 202-2 by repeating the transfer of electric charges from the photodiode 201 to the capacitive element 202-2. This transfer operation can be repeated by repeatedly causing the signal pTX2 to transition from non-active level to active level, and then to non-active level in sequence. Thus, even when high-luminance light, which is saturated in the case of accumulation of electric charges in the photodiode 201 alone, enters the photodiode 201, electric charges corresponding to the luminance can be retained in the capacitive element 202-2. The signal pTX1 may also be caused to transition from non-active level to active level, and then to non-active level in sequence. Thus, electric charges exceeding the saturation capacitance of the photodiode 201 can also be retained in the capacitive element 202-1.

Fifth Embodiment

An imaging device according to a fifth embodiment will be described mainly about differences from the fourth embodiment. In the imaging device of the present embodiment, each pixel includes a plurality of photodiodes. The plurality of photodiodes are arranged to allow entry of light transmitted through one microlens. Light transmitted through regions with different exit pupils enters the plurality of photodiodes. A phase difference is detected from a signal based on electric charges generated by one of the plurality of photodiodes and a signal based on electric charges generated by another of the plurality of photodiodes. In accordance with the detected phase difference, an autofocus operation can be performed, in which the focus of an optical system that causes light to enter the imaging device is adjusted to the subject.

Figure 11:
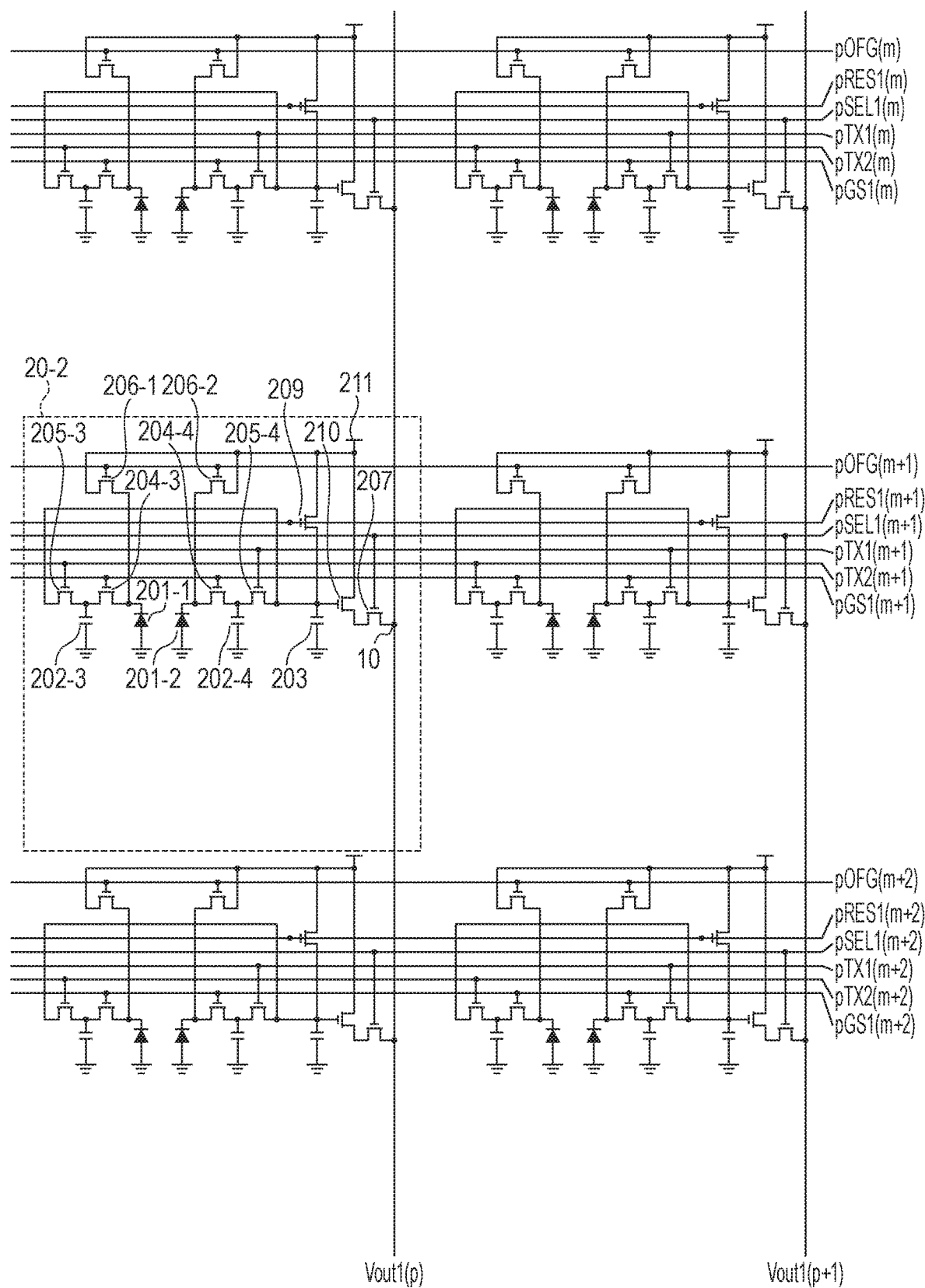
FIG. 11 illustrates a circuit configuration of pixels according to a fifth embodiment.

FIG. 11 is a circuit diagram of pixels 20-2 of the present embodiment. The pixels 20-2 each include a photodiode 201-1 and a photodiode 201-2. The photodiode 201-1 and the photodiode 201-2 are arranged to allow entry of light transmitted through one microlens.

A transfer transistor 204-3 and a PD reset transistor 206-1 are connected to the photodiode 201-1. A capacitive element 202-3 is connected through the transfer transistor 204-3 to the photodiode 201-1. The capacitive element 202-3 is connected through a transfer transistor 205-3 to the FD portion 203.

A transfer transistor 204-4 and a PD reset transistor 206-2 are connected to the photodiode 201-2. A capacitive element 202-4 is connected through the transfer transistor 204-4 to the photodiode 201-2. The capacitive element 202-4 is connected through a transfer transistor 205-4 to the FD portion 203.

Figure 12:
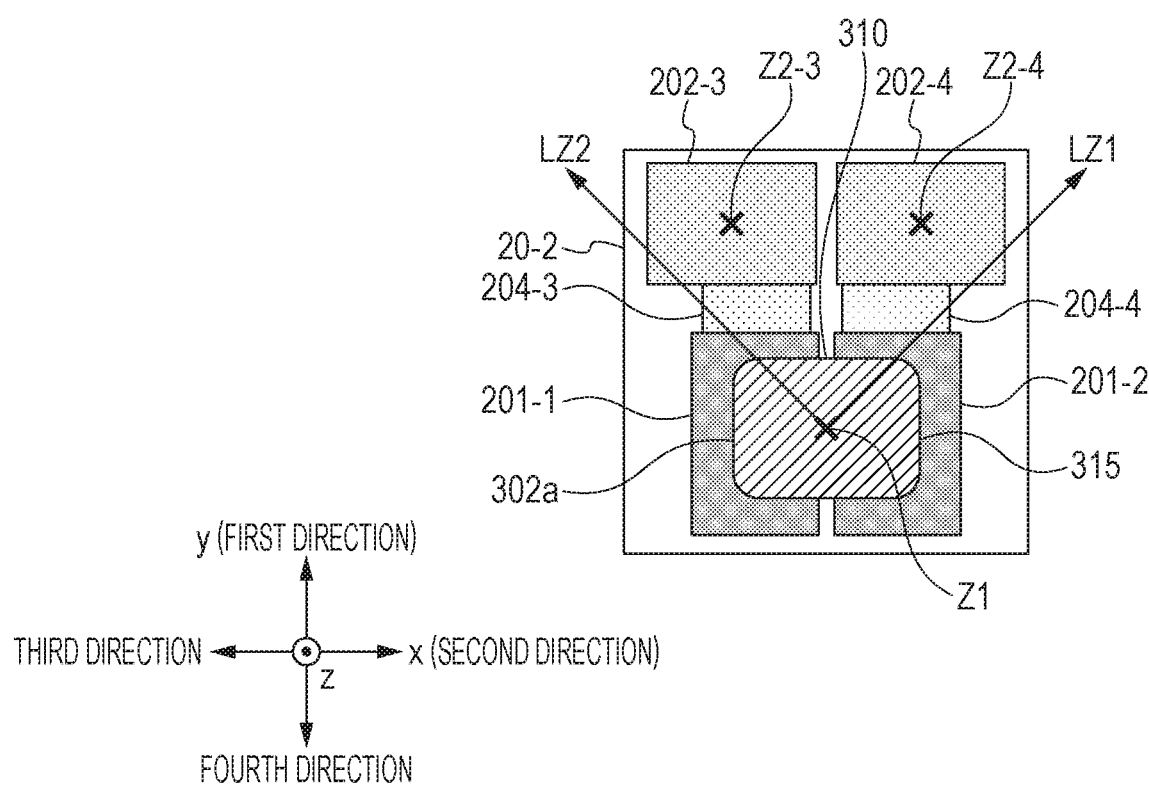
FIG. 12 is a plan view illustrating a layout of a pixel according to the fifth embodiment.

FIG. 12 illustrates a layout of the photodiode 201-1, the photodiode 201-2, the transfer transistor 204-3, the transfer transistor 204-4, the capacitive element 202-3, the capacitive element 202-4, and the exit plane 302a of the pixel 20-2 illustrated in FIG. 11.

A center of gravity Z2-3 of the capacitive element 202-3 and a center of gravity Z2-4 of the capacitive element 202-4 are located in the region between the first line LZ1 and the second line LZ2 both extending from the center of gravity Z1 of the exit plane 302a.

The capacitive element 202-3 and the capacitive element 202-4 are disposed between the long side 310 of the exit plane 302a and the element isolation region 400 (see the first embodiment) extending in a direction corresponding to the second direction.

Thus, as in the imaging device of the fourth embodiment, the imaging device of the present embodiment can achieve both improved sensitivity and reduced degradation of image quality. In the imaging device of the present embodiment, a plurality of photodiodes are provided for one microlens. The imaging device of the present embodiment thus can perform an autofocus operation which involves detecting a phase difference.

Sixth Embodiment

A sixth embodiment will be described mainly about differences from the fifth embodiment. An imaging device of the present embodiment also includes pixels each including a plurality of photodiodes for one microlens. The pixel of the imaging device according to the present embodiment differs from that of the imaging device of the fifth embodiment in that a plurality of capacitive elements are connected to each of the plurality of photodiodes.

Figure 13:
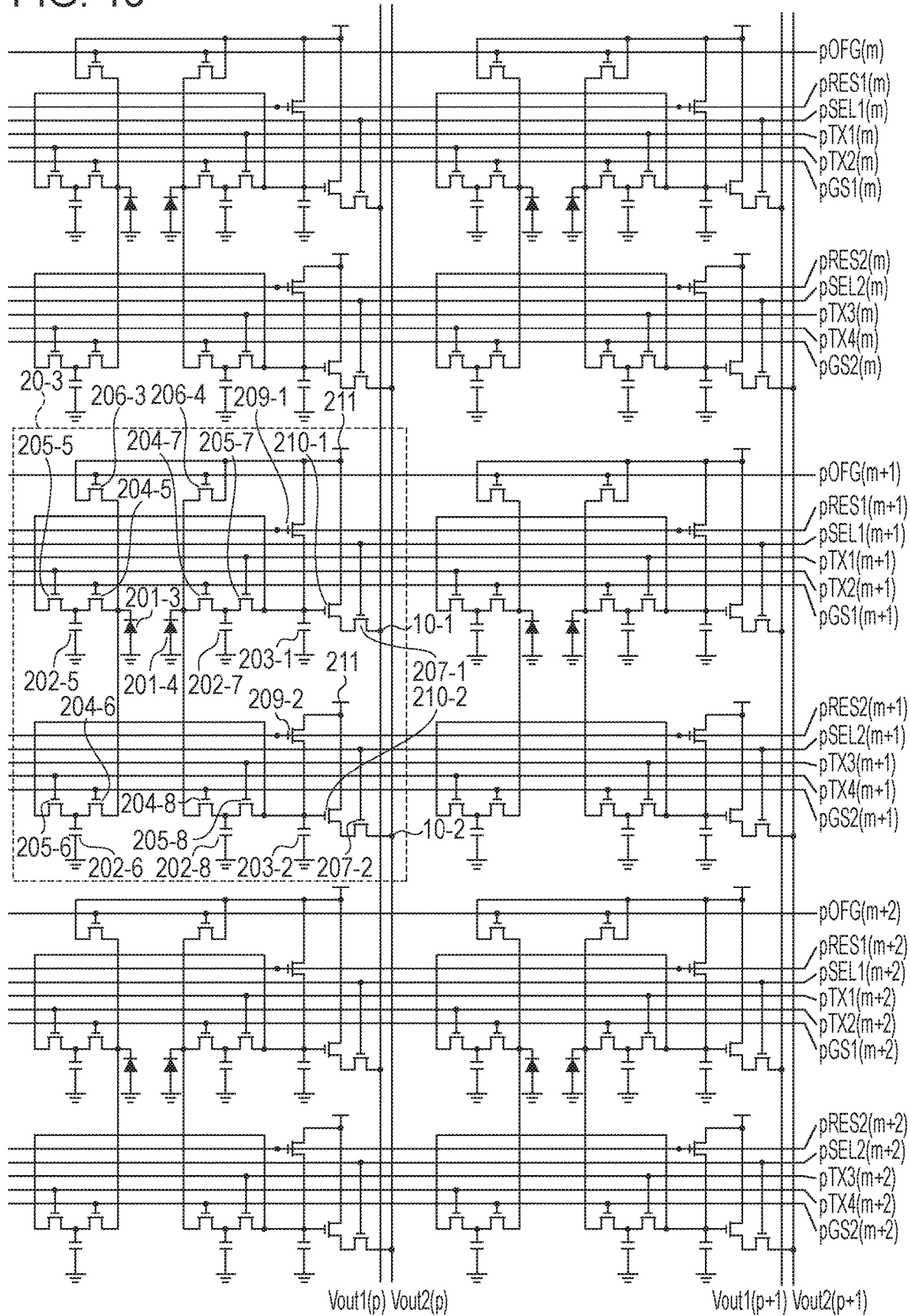
FIG. 13 illustrates a circuit configuration of pixels according to a sixth embodiment.

FIG. 13 is a circuit diagram of pixels of the imaging device according to the present embodiment. Each pixel 20-3 includes a photodiode 201-3 and a photodiode 201-4. The photodiode 201-3 and the photodiode 201-4 are arranged to allow entry of light transmitted through one microlens. Light transmitted through regions with different exit pupils enters the photodiode 201-3 and the photodiode 201-4. A phase difference is detected from a signal based on electric charges generated by one of the photodiode 201-3 and the photodiode 201-4 and a signal based on electric charges generated by the other of the photodiode 201-3 and the photodiode 201-4. In accordance with the detected phase difference, an autofocus operation can be performed, in which the focus of the optical system that causes light to enter the imaging device is adjusted to the subject.

The photodiode 201-3 is connected through a transfer transistor 204-5 to a capacitive element 202-5. The photodiode 201-3 is connected through a transfer transistor 204-6 to a capacitive element 202-6. The photodiode 201-3 is connected to a PD reset transistor 206-3.

The capacitive element 202-5 is connected through a transfer transistor 205-5 to an FD portion 203-1. The capacitive element 202-6 is connected through a transfer transistor 205-6 to the FD portion 203-1.

The FD portion 203-1 is connected to the gate of an amplifying transistor 210-1. The amplifying transistor 210-1 is connected through a selecting transistor 207-1 to a column signal line 10-1.

The photodiode 201-4 is connected through a transfer transistor 204-7 to a capacitive element 202-7. The photodiode 201-4 is connected through a transfer transistor 204-8 to a capacitive element 202-8. The photodiode 201-4 is connected to a PD reset transistor 206-4.

The capacitive element 202-7 is connected through a transfer transistor 205-7 to an FD portion 203-2. The capacitive element 202-8 is connected through a transfer transistor 205-8 to the FD portion 203-2.

The FD portion 203-2 is connected to the gate of an amplifying transistor 210-2. The amplifying transistor 210-2 is connected through a selecting transistor 207-2 to a column signal line 10-2.

Figure 14A:
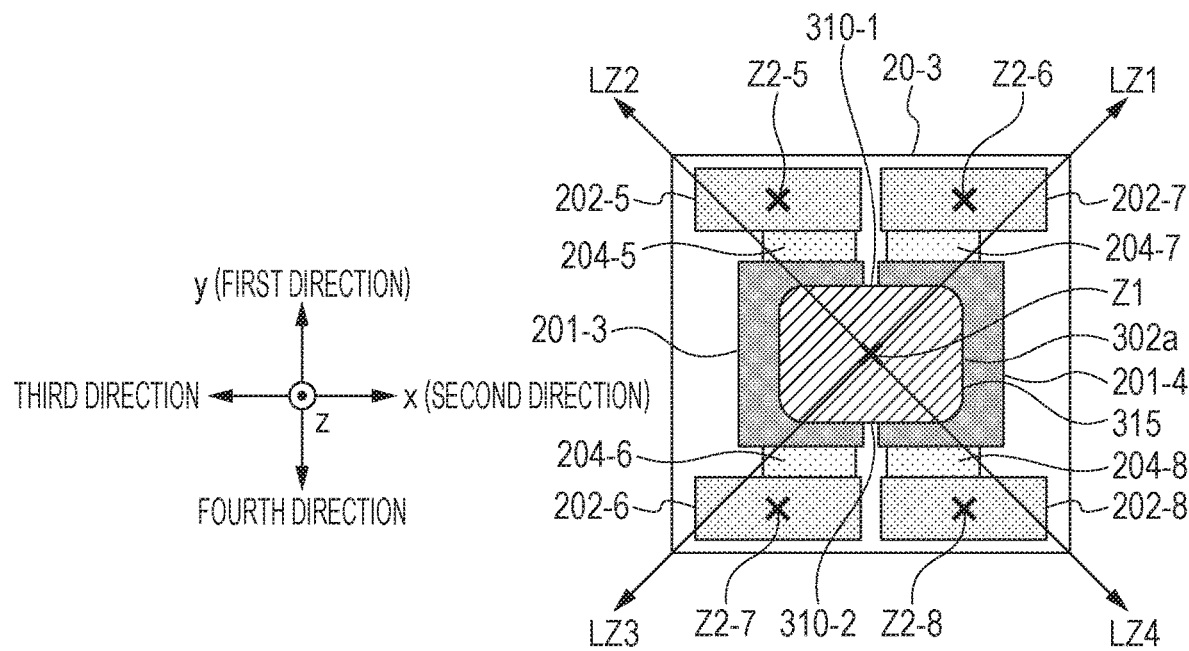
FIGS. 14A and 14B are plan views each illustrating a layout of a pixel according to the sixth embodiment.
Figure 14B:
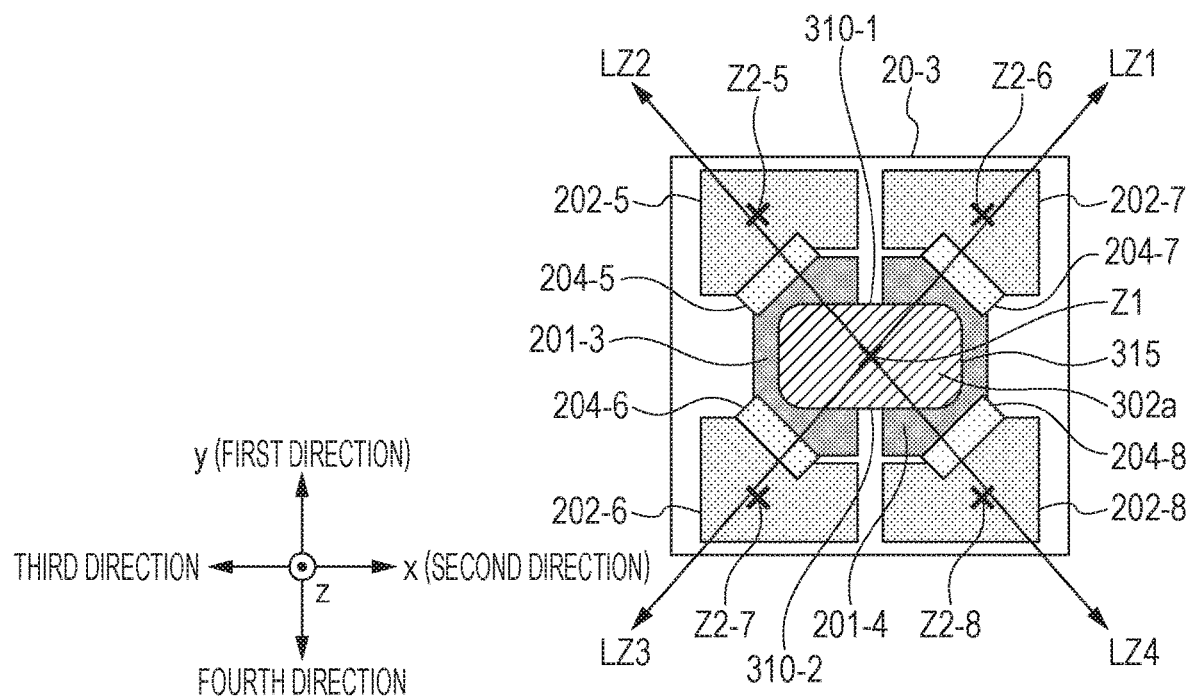

FIGS. 14A and 14B each illustrate a layout of the photodiodes 201-3 and 201-4, the transfer transistors 204-5, 204-6, 204-7 and 204-8, the capacitive elements 202-5, 202-6, 202-7, and 202-8, and the exit plane 302a of the pixel 20-3 illustrated in FIG. 13. Reference numerals shown in FIGS. 14A and 14B correspond to those in FIG. 13.

The pixel 20-3 illustrated in FIG. 14A includes the photodiodes 201-3 and 201-4 having a rectangular shape. A center of gravity Z2-5 of the capacitive element 202-5 and a center of gravity Z2-6 of the capacitive element 202-7 are located in the region between the first line LZ1 and the second line LZ2 both extending from the center of gravity Z1 of the exit plane 302a. Similarly, a center of gravity Z2-7 of the capacitive element 202-6 and a center of gravity Z2-8 of the capacitive element 202-8 are located in the region between the third line LZ3 and the fourth line LZ4 both extending from the center of gravity Z1 of the exit plane 302a. The third line LZ3 is a bisector that divides the angle between the third direction and the fourth direction into two equal parts. The fourth line LZ4 is a bisector that divides the angle between the second direction and the fourth direction into two equal parts.

The capacitive element 202-5 and the capacitive element 202-7 are disposed between the element isolation region 400 (see the first embodiment) formed between the pixels 20-3 adjacent in the first direction and extending in a direction corresponding to the second direction, and the long side 310-1 of the exit plane 302a. Similarly, the capacitive element 202-6 and the capacitive element 202-8 are disposed between the element isolation region 400 formed between the pixels 20-3 adjacent in the fourth direction and extending in a direction corresponding to the second direction, and the long side 310-2 of the exit plane 302a.

FIG. 14B illustrates another layout of one of the pixels 20-3 illustrated in FIG. 13. The capacitive elements 202-5, 202-6, 202-7, and 202-8 each include a portion extending in the second direction and another portion extending therefrom in the first or fourth direction. Again, the center of gravity Z2-5 of the capacitive element 202-5 and the center of gravity Z2-6 of the capacitive element 202-7 are located in the region between the first line LZ1 and the second line LZ2. Also, the center of gravity Z2-7 of the capacitive element 202-6 and the center of gravity Z2-8 of the capacitive element 202-8 are located in the region between the third line LZ3 and the fourth line LZ4.

The capacitive element 202-5 and the capacitive element 202-7 are disposed between the element isolation region 400 (see the first embodiment) formed between the pixels 20-3 adjacent in the first direction and extending in a direction corresponding to the second direction, and the long side 310-1 of the exit plane 302a. Similarly, the capacitive element 202-6 and the capacitive element 202-8 are disposed between the element isolation region 400 formed between the pixels 20-3 adjacent in the fourth direction and extending in a direction corresponding to the second direction, and the long side 310-2 of the exit plane 302a.

In another respect, the pixels 20-3 each including the light guiding path 302 of the present embodiment can also be two-dimensionally arranged as illustrated in FIG. 3A. The pair of photodiodes 201-3 and 201-4 of the first pixel and the pair of photodiodes 201-3 and 201-4 of the second pixel are arranged along the first direction. In the examples of FIGS. 14A and 14B, the capacitive elements 202-5 and 202-7 of the first pixel are disposed between the pair of photodiodes 201-3 and 201-4 of the first pixel and the pair of photodiodes 201-3 and 201-4 of the second pixel. The pair of photodiodes 201-3 and 201-4 of the first pixel and the pair of photodiodes 201-3 and 201-4 of the third pixel are arranged along the fourth direction opposite the first direction. The capacitive elements 202-6 and 202-8 of the first pixel are disposed between the pair of photodiodes 201-3 and 201-4 of the first pixel and the pair of photodiodes 201-3 and 201-4 of the third pixel.

With the layout of either FIG. 14A or 14B, the imaging device of the present embodiment can also achieve both improved sensitivity and reduced degradation of image quality.

Seventh Embodiment

Figure 15:
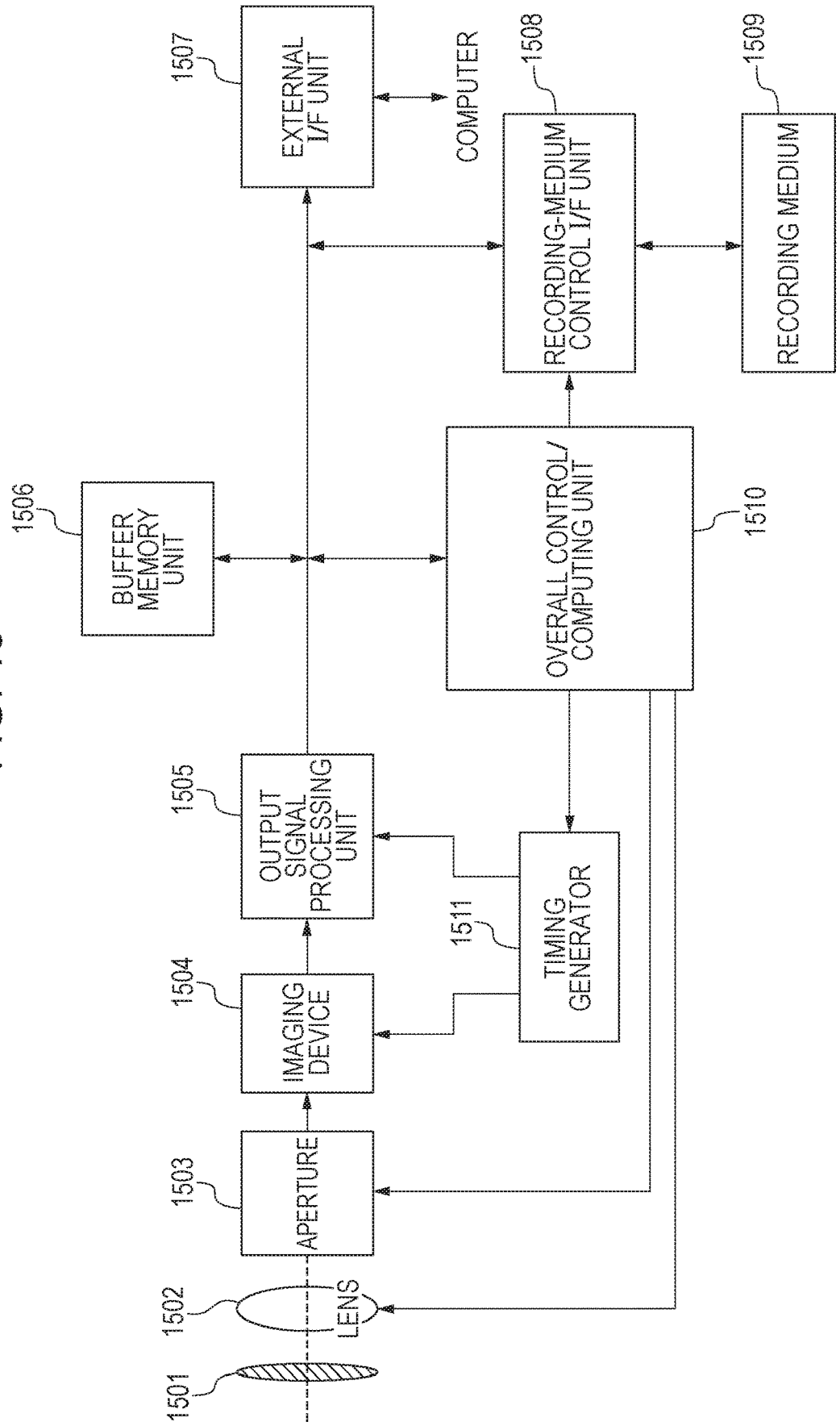
FIG. 15 illustrates a configuration of an imaging system according to a seventh embodiment.

An embodiment of an imaging system according to the present invention will now be described. Examples of the imaging system include digital still cameras, digital camcorders, camera heads, copiers, facsimiles, mobile phones, vehicle-mounted cameras, and observation satellites. FIG. 15 is a block diagram of a digital still camera serving as an example of the imaging system.

The present embodiment relates to an imaging system that includes, in the form of an imaging device 1504, the imaging device according to any of the embodiments described above.

The imaging system illustrated in FIG. 15 includes a barrier 1501 for lens protection, a lens 1502 that forms an optical image of a subject on the imaging device 1504, and an aperture 1503 for varying the amount of light passing through the lens 1502. The lens 1502 and the aperture 1503 form an optical system that concentrates light onto the imaging device 1504. The imaging system illustrated in FIG. 15 further includes an output signal processing unit 1505 that processes output signals from the imaging device 1504. The output signal processing unit 1505 performs various types of correction and compression as necessary, and outputs signals. Also, the output signal processing unit 1505 generates an image using signals output from the imaging device 1504.

The imaging system illustrated in FIG. 15 further includes a buffer memory unit 1506 for temporarily storing image data, and an external interface (I/F) unit 1507 for communicating with an external computer and the like. The imaging system further includes a removable recording medium 1509, such as a semiconductor memory, for recording or reading captured image data, and a recording-medium control interface (I/F) unit 1508 for recording data on or reading data from the recording medium 1509. The imaging system further includes an overall control/computing unit 1510 that controls various computations and an overall operation of the digital still camera, and a timing generator 1511 that outputs various timing signals to the imaging device 1504 and the output signal processing unit 1505. The timing signals and the like may be input from the outside. The imaging system may have any configuration as long as it includes at least the imaging device 1504 and the output signal processing unit 1505 that processes output signals from the imaging device 1504.

As described in the fifth and sixth embodiments, the pixels 20 may each include a plurality of photodiodes for one microlens. In this case, the output signal processing unit 1505 processes a signal based on electric charges generated by one of the photodiodes of the pixel 20 and a signal based on electric charges generated by the other photodiode of the pixel 20. The output signal processing unit 1505 can thus acquire distance information about the distance from the imaging device 1504 to the subject. The pixels 20 may each include more photoelectric converters for one microlens. That is, the output signal processing unit 1505 uses a signal based on electric charges generated by a part of a plurality of photoelectric converters (ex. photodiodes) corresponding to one microlens and a signal based on electric charges generated by another part of the plurality of photoelectric converters. That is, the output signal processing unit 1505 may be configured to acquire distance information about the distance from the imaging device 1504 to the subject using these two signals. In this case, the signal based on electric charges generated by the another part of the plurality of photoelectric converters may be obtained by subtracting the signal based on electric charges generated by the part of the photoelectric converters from a signal based on the sum of electric charges generated by the plurality of photoelectric converters.

The output signal processing unit 1505 is disposed on a second semiconductor substrate different from a first semiconductor substrate having the imaging device 1504 thereon. The first semiconductor substrate and the second semiconductor substrate may be provided as separate chips, or may be stacked together to form a single chip.

As described above, the imaging system of the present embodiment is capable of performing an imaging operation using the imaging device 1504.

Eighth Embodiment

Figure 16A:
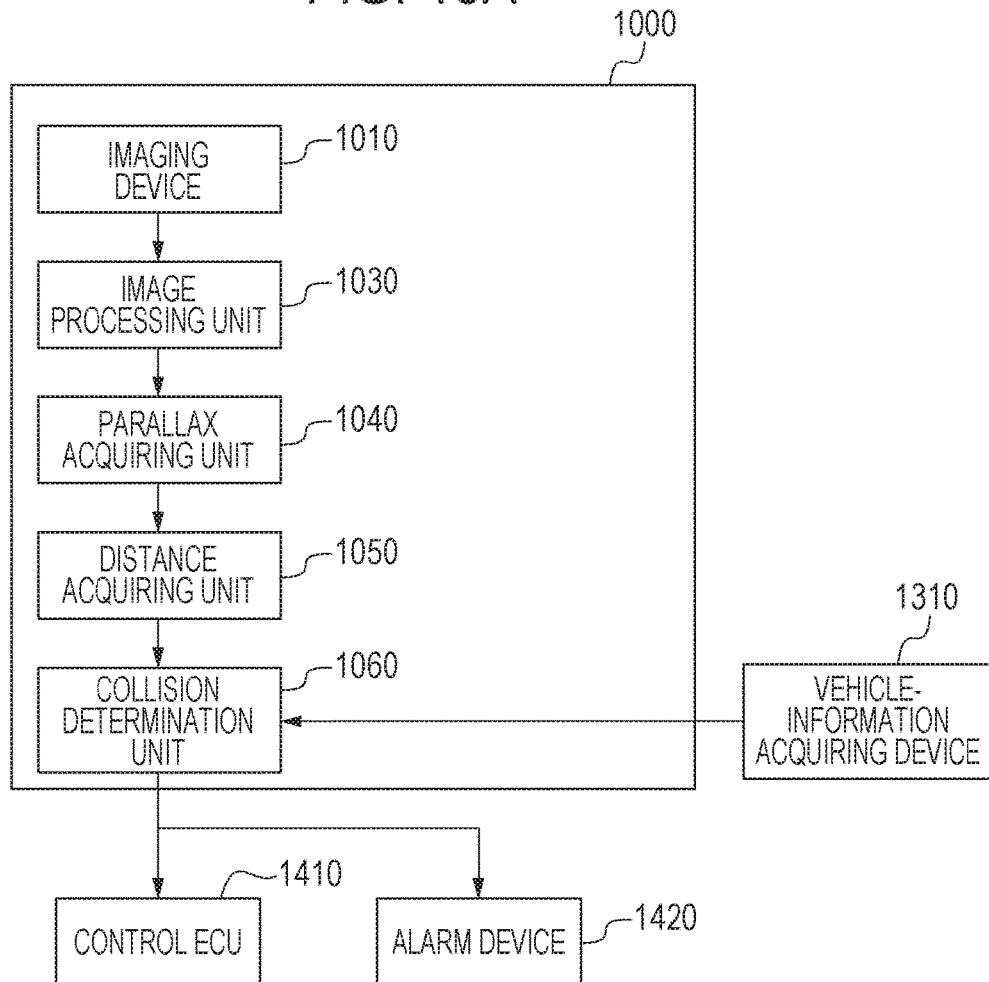
FIGS. 16A and 16B illustrate a configuration of an imaging system according to an eighth embodiment.

FIG. 16A illustrates an imaging system related to a vehicle-mounted camera. An imaging system 1000 is an imaging system that includes, in the form of an imaging device 1010, the imaging device according to any of the embodiments described above. The imaging system 1000 includes an image processing unit 1030 that performs image processing on a plurality of pieces of image data acquired by the imaging device 1010, and a parallax acquiring unit 1040 that acquires a parallax (i.e., a phase difference between parallax images) from the plurality of pieces of image data acquired by the imaging system 1000.

If the imaging system 1000 is a stereo camera that includes a plurality of imaging devices 1010, the parallax may be acquired using signals output from the plurality of imaging devices 1010. The imaging system 1000 may include the imaging device 1010 that includes a plurality of photoelectric converters for one microlens. In this case, the parallax acquiring unit 1040 acquires a parallax by processing a signal based on electric charges generated by a part of the plurality of photoelectric converters and a signal based on electric charges generated by another part of the plurality of photoelectric converters. That is, the parallax acquiring unit 1040 may acquire a parallax using a signal based on electric charges generated by the part of the plurality of photoelectric converters corresponding to one microlens and a signal based on electric charges generated by the another part of the plurality of photoelectric converters. In this case, the signal based on electric charges generated by the another part of the plurality of photoelectric converters may be obtained by subtracting the signal based on electric charges generated by the part of the plurality of photoelectric converters from a signal based on the sum of electric charges generated by the plurality of photoelectric converters.

The imaging system 1000 includes a distance acquiring unit 1050 that acquires a distance to an object on the basis of the acquired parallax, and a collision determination unit 1060 that determines the possibility of collision on the basis of the acquired distance. The parallax acquiring unit 1040 and the distance acquiring unit 1050 are examples of a distance information acquiring unit that acquires distance information about a distance to the object. That is, the distance information is information about a parallax, the amount of defocusing, a distance to the object, and the like. The collision determination unit 1060 may determine the possibility of collision using any of the distance information described above. The distance information acquiring unit may be implemented by specifically-designed hardware, a software module, or a combination of both. The distance information acquiring unit may be implemented by a field programmable gate array (FPGA), an application specific integrated circuit (ASIC), or a combination of both.

The imaging system 1000 is connected to a vehicle information acquiring device 1310 and can acquire vehicle information, such as a vehicle speed, a yaw rate, and a rudder angle. The imaging system 1000 is also connected to a control ECU 1410 which is a control unit that outputs a control signal for generating a braking force to a vehicle on the basis of the determination made by the collision determination unit 1060. The imaging system 1000 is also connected to an alarm device 1420 that gives an alarm to a vehicle driver on the basis of the determination made by the collision determination unit 1060. For example, if the collision determination unit 1060 determines that a collision is highly likely, the control ECU 1410 performs vehicle control to avoid the collision or reduce damage by applying the brake, releasing the accelerator, or suppressing the engine output. The alarm device 1420 gives an alarm to the user, for example, by sounding an audio alarm, displaying alarm information on the screen of a car navigation system, or vibrating the seatbelt or steering wheel.

In the present embodiment, the imaging system 1000 captures an image of the surroundings of the vehicle, such as the front or rear of the vehicle.

Figure 16B:
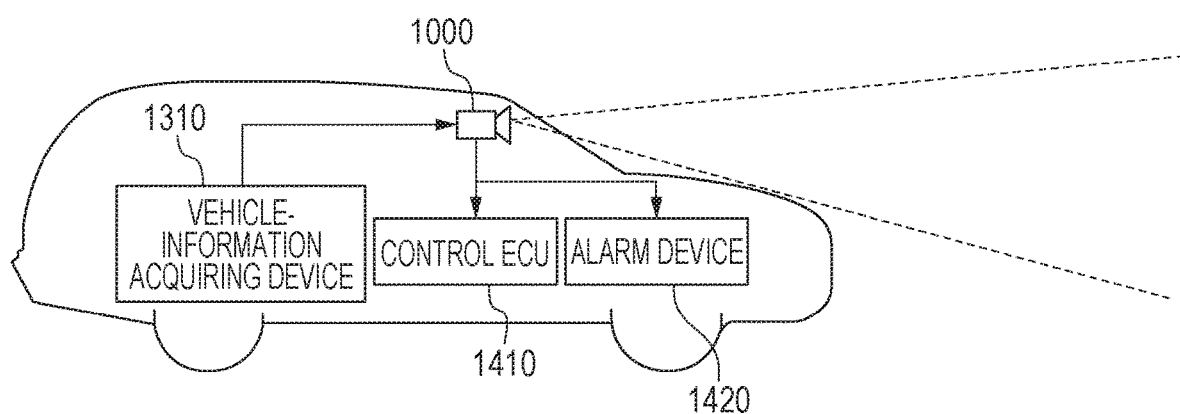

FIG. 16B illustrates the imaging system 1000 that is operating to capture an image of the front of the vehicle.

Although a control operation for avoiding a collision with other vehicles has been described, the same configuration is also applicable to a self-driving control operation for following other vehicles, and to a self-driving control operation for not driving out of the lane. The imaging system described above is applicable not only to vehicles, such as those having the imaging system mounted thereon, but also to moving bodies (moving devices), such as ships, aircrafts, and industrial robots. The imaging system is applicable not only to moving bodies, but is also widely applicable to devices using an object recognition technique, such as intelligent transport systems (ITSs).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imaging device comprising a plurality of pixels two-dimensionally arranged, the pixels each including
    a first photoelectric converter formed in a semiconductor substrate,
    a light guiding path disposed above the first photoelectric converter and having an entrance surface and an exit surface,
    a first charge accumulation portion formed in the semiconductor substrate and to which electric charges are transferred from the first photoelectric converter, and
    a floating diffusion portion formed in the semiconductor substrate and to which electric charges are transferred from the first charge accumulation portion,
    wherein the first photoelectric converter of a first pixel of the plurality of pixels and the first photoelectric converter of a second pixel of the plurality of pixels are arranged along a first direction;
    at least part of the first charge accumulation portion of the first pixel is disposed between the first photoelectric converter of the first pixel and the first photoelectric converter of the second pixel; and
    the exit surface of the light guiding path of the first pixel is longer in a second direction orthogonal to the first direction in plan view than in the first direction.

2. The imaging device according to claim 1, wherein the exit surface has a short side extending in the first direction and a long side extending in the second direction;
    a length of the exit surface in the first direction is a length of the short side; and
    a length of the exit surface in the second direction is a length of the long side.

3. The imaging device according to claim 1, wherein the exit surface is in a shape of an ellipse;
    a length of the exit surface in the first direction is a length of a minor axis of the ellipse;
    a length of the exit surface in the second direction is a length of a major axis of the ellipse; and
    at least part of the first charge accumulation portion of the first pixel is disposed between the major axis of the exit surface of the first pixel and the major axis of the exit surface of the second pixel in plan view.

4. The imaging device according to claim 1, wherein the plurality of pixels each further include a second charge accumulation portion to which electric charges are transferred from the first photoelectric converter; and
    at least part of the second charge accumulation portion of the first pixel is disposed between the first photoelectric converter of the first pixel and the first photoelectric converter of the second pixel in plan view.

5. The imaging device according to claim 1, wherein the plurality of pixels each further include a second charge accumulation portion to which electric charges are transferred from the first photoelectric converter;
    the first photoelectric converter of a third pixel of the plurality of pixels and the first photoelectric converter of the first pixel are arranged along a third direction opposite the first direction in plan view; and
    at least part of the second charge accumulation portion of the first pixel is disposed between the first photoelectric converter of the first pixel and the first photoelectric converter of the third pixel.

6. The imaging device according to claim 1, wherein the plurality of pixels each further include
    a second photoelectric converter, and
    a third charge accumulation portion to which electric charges are transferred from the second photoelectric converter; and
    wherein at least part of the third charge accumulation portion of the first pixel is disposed between the first photoelectric converter of the first pixel and the first photoelectric converter of the second pixel.

7. The imaging device according to claim 1, wherein the plurality of pixels each further include
    a second photoelectric converter, and
    a third charge accumulation portion to which electric charges are transferred from the second photoelectric converter;
    wherein the first photoelectric converter of a third pixel of the plurality of pixels and the first photoelectric converter of the first pixel are arranged along a third direction opposite the first direction in plan view; and
    at least part of the third charge accumulation portion of the first pixel is disposed between the first photoelectric converter of the first pixel and the first photoelectric converter of the third pixel.

8. The imaging device according to claim 1,
    wherein the first charge accumulation portion is disposed such that, in plan view, a center of gravity thereof is located in a region between a first bisector and a second bisector both extending from a first center of gravity, which is a center of gravity of the exit surface, the first bisector dividing an angle between the first direction and the second direction into two equal parts, the second bisector dividing an angle between a third direction opposite the second direction and the first direction into two equal parts.

9. The imaging device according to claim 8, wherein the exit surface has a short side extending in the first direction and a long side extending in the second direction;
    a length of the exit surface in the first direction is a length of the short side; and
    a length of the exit surface in the second direction is a length of the long side.

10. The imaging device according to claim 1, wherein the exit surface is in a shape of a rectangle.

11. The imaging device according to claim 1, wherein the exit surface is in a shape of an ellipse;
    a length of the exit surface in the first direction is a length of a minor axis of the ellipse; and
    a length of the exit surface in the second direction is a length of a major axis of the ellipse.

12. The imaging device according to claim 1, wherein the exit surface is in a shape of a hexagon;

a length of the exit surface in the second direction is a length of a longest diagonal of the hexagon; and
a length of the exit surface in the first direction is a length of a diagonal of the hexagon orthogonal to the longest diagonal.

13. The imaging device according to claim 8, wherein the plurality of pixels each further includes a second charge accumulation portion to which electric charges are transferred from the first photoelectric converter; and
the second charge accumulation portion is disposed such that, in plan view, a center of gravity thereof is located in the region between the first bisector and the second bisector.

14. The imaging device according to claim 1, wherein the plurality of pixels each further includes a second charge accumulation portion to which electric charges are transferred from the first photoelectric converter; and
the second charge accumulation portion is disposed such that, in plan view, a center of gravity thereof is located between a third bisector and a fourth bisector both extending from a first center of gravity, which is a center of gravity of the exit surface, the third bisector dividing an angle between a fourth direction opposite the first direction and the second direction into two equal parts, the fourth bisector dividing an angle between the third direction and the fourth direction into two equal parts.

15. The imaging device according to claim 8, wherein the plurality of pixels each further includes
a second photoelectric converter, and
a third charge accumulation portion to which electric charges are transferred from the second photoelectric converter; and
the third charge accumulation portion is disposed such that, in plan view, a center of gravity thereof is located in the region between the first bisector and the second bisector.

16. The imaging device according to claim 1, wherein the plurality of pixels each further includes
a second photoelectric converter, and
a third charge accumulation portion to which electric charges are transferred from the second photoelectric converter; and
the third charge accumulation portion is disposed such that, in plan view, a center of gravity thereof is located between a third bisector and a fourth bisector both extending from a first center of gravity, which is a center of gravity of the exit surface, the third bisector dividing an angle between a fourth direction opposite the first direction and the second direction into two equal parts, the fourth bisector dividing an angle between the third direction and the fourth direction into two equal parts.

17. An imaging device comprising a pixel including
a first photoelectric converter formed in a semiconductor substrate,
a light guiding path disposed above the first photoelectric converter and having an entrance surface and an exit surface,
a first charge accumulation portion formed in the semiconductor substrate and to which electric charges are transferred from the first photoelectric converter, and
a floating diffusion portion formed in the semiconductor substrate and to which electric charges are transferred from the first charge accumulation portion,
wherein the exit surface of the light guiding path is longer in a second direction orthogonal to a first direction in plan view than in the first direction,
wherein a first end portion and a second end portion which define a longest distance on the exit surface are arranged along the second direction orthogonal to the first direction in plan view, and
wherein at least part of the first charge accumulation portion is a region outside the first photoelectric converter and is disposed inside a region formed by displacing the first end portion and the second end portion along the first direction in plan view.

18. The imaging device according to claim 17, wherein the exit surface is in a shape of an ellipse;
a length of the exit surface in the first direction is a length of a minor axis of the ellipse;
a length of the exit surface in the second direction is a length of a major axis of the ellipse; and
at least part of the first charge accumulation portion is disposed between the major axis of the exit surface of one pixel and the major axis of the exit surface of another pixel in plan view.

19. The imaging device according to claim 17, wherein the exit surface is in a shape of a rectangle.

20. The imaging device according to claim 17, wherein the exit surface is in a shape of a hexagon;
a length of the exit surface in the second direction is a length of a longest diagonal of the hexagon; and
a length of the exit surface in the first direction is a length of a diagonal of the hexagon orthogonal to the longest diagonal.

21. An imaging system comprising:
the imaging device according to claim 1; and
a signal processing unit configured to generate an image by processing a signal output by the imaging device.

22. An imaging system comprising:
the imaging device according to claim 17; and
a signal processing unit configured to generate an image by processing a signal output by the imaging device.

23. An imaging system comprising:
the imaging device according to claim 6; and
a signal processing unit configured to generate an image by processing a signal output by the imaging device,
wherein the signal processing unit generates distance information about a distance to a subject from a signal based on electric charges of the first photoelectric converter and a signal based on electric charges of the second photoelectric converter.

24. A moving body comprising:
the imaging device according to claim 1;
a distance information acquiring unit configured to acquire distance information about a distance to an object on the basis of a signal from the imaging device; and
a control unit configured to control the moving body on the basis of the distance information.

25. A moving body comprising:
the imaging device according to claim 17;
a distance information acquiring unit configured to acquire distance information about a distance to an object on the basis of a signal from the imaging device; and
a control unit configured to control the moving body on the basis of the distance information.

* * * * *